US010692886B2

(12) United States Patent
Kasashima et al.

(10) Patent No.: US 10,692,886 B2
(45) Date of Patent: Jun. 23, 2020

(54) SEMICONDUCTOR MEMORY DEVICE HAVING VERTICAL SEMICONDUCTOR FILMS WITH NARROWING WIDTHS AND GATE INSULATING FILMS WITH DIFFERENT THICKNESS

(71) Applicant: TOSHIBA MEMORY CORPORATION, Minato-ku (JP)

(72) Inventors: Shunsuke Kasashima, Yokkaichi (JP); Jun Nishimura, Kuwana (JP); Takamitsu Ochi, Kuwana (JP); Hisashi Harada, Yokkaichi (JP); Ayaha Hachisuga, Yokkaichi (JP); Ayako Kawanishi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/291,497

(22) Filed: Mar. 4, 2019

(65) Prior Publication Data
US 2020/0075624 A1 Mar. 5, 2020

(30) Foreign Application Priority Data

Aug. 31, 2018 (JP) .................................. 2018-163858

(51) Int. Cl.
*H01L 27/11582* (2017.01)
*H01L 27/11568* (2017.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC ......... H01L 27/11582; H01L 27/11556; H01L 27/11568; H01L 27/1157; H01L 27/11521; H01L 27/11524
See application file for complete search history.

(56) References Cited

U.S. PATENT DOCUMENTS 9,806,091 B2   10/2017  Miyagawa et al.
2012/0061744 A1*  3/2012  Hwang ............. H01L 27/11565
                                                 257/324
(Continued)

FOREIGN PATENT DOCUMENTS

JP            2017-174866         9/2017

*Primary Examiner* — Younes Boulghassoul
(74) *Attorney, Agent, or Firm* — Oblon, McClelland, Maier & Neustadt, L.L.P.

(57) ABSTRACT

A semiconductor memory device according to an embodiment includes: a substrate; a plurality of first gate electrodes; a first semiconductor film facing the plurality of first gate electrodes; and a first gate insulating film provided between the plurality of first gate electrodes and the first semiconductor film. Moreover, this semiconductor memory device includes: a plurality of second gate electrodes; a second semiconductor film facing the plurality of second gate electrodes; and a second gate insulating film provided between the plurality of second gate electrodes and the second semiconductor film. Moreover, this semiconductor memory device includes: a third gate electrode that is provided between the plurality of first gate electrodes and the plurality of second gate electrodes, and extends in a second direction; and a third gate insulating film provided between the third gate electrode and the first semiconductor film. Moreover, a thickness in a first direction of the third gate insulating film is larger than a width in the second direction of the first gate insulating film and the second gate insulating film.

9 Claims, 32 Drawing Sheets

(51) Int. Cl.
*H01L 27/1157* (2017.01)
*H01L 27/11573* (2017.01)
*H01L 27/11565* (2017.01)
*H01L 29/10* (2006.01)
*H01L 21/02* (2006.01)
*H01L 21/3065* (2006.01)
*H01L 21/311* (2006.01)
*H01L 21/3213* (2006.01)
*H01L 21/28* (2006.01)

(52) U.S. Cl.
CPC .. *H01L 27/11568* (2013.01); *H01L 27/11573* (2013.01); *H01L 29/1037* (2013.01); *H01L 21/0217* (2013.01); *H01L 21/0262* (2013.01); *H01L 21/02164* (2013.01); *H01L 21/02274* (2013.01); *H01L 21/02636* (2013.01); *H01L 21/3065* (2013.01); *H01L 21/31111* (2013.01); *H01L 21/31116* (2013.01); *H01L 21/32136* (2013.01); *H01L 29/40117* (2019.08)

(56) References Cited

U.S. PATENT DOCUMENTS

| | | | |
|---|---|---|---|
| 2015/0061155 A1* | 3/2015 | Seo | H01L 29/16 257/774 |
| 2015/0155296 A1* | 6/2015 | Yoon | H01L 27/11582 257/324 |
| 2015/0262685 A1* | 9/2015 | Shirakawa | G11C 16/14 365/185.29 |
| 2016/0005760 A1* | 1/2016 | Lee | H01L 27/1157 257/324 |
| 2016/0190155 A1* | 6/2016 | Lee | H01L 27/11582 438/268 |
| 2016/0322381 A1* | 11/2016 | Liu | H01L 27/11573 |
| 2017/0062462 A1* | 3/2017 | Lee | H01L 27/11582 |
| 2017/0287926 A1* | 10/2017 | Ariyoshi | H01L 27/11565 |
| 2017/0345843 A1* | 11/2017 | Lee | H01L 23/5226 |
| 2018/0053774 A1* | 2/2018 | Sakamoto | H01L 29/1037 |
| 2018/0240811 A1* | 8/2018 | Kim | H01L 27/11565 |
| 2018/0331117 A1* | 11/2018 | Titus | H01L 27/11582 |
| 2018/0358371 A1* | 12/2018 | Hwang | H01L 29/4234 |
| 2018/0374867 A1* | 12/2018 | Yun | H01L 27/11565 |
| 2019/0081017 A1* | 3/2019 | Nakajima | H01L 24/05 |
| 2019/0088674 A1* | 3/2019 | Konno | H01L 27/11573 |
| 2019/0304992 A1* | 10/2019 | Baek | H01L 27/11556 |
| 2020/0006373 A1* | 1/2020 | Kubo | H01L 21/7688 |

* cited by examiner

SEMICONDUCTOR MEMORY DEVICE HAVING VERTICAL SEMICONDUCTOR FILMS WITH NARROWING WIDTHS AND GATE INSULATING FILMS WITH DIFFERENT THICKNESS

CROSS-REFERENCE TO RELATED APPLICATIONS

This application is based upon and claims the benefit of Japanese Patent Application No. 2018-163858, filed on Aug. 31, 2018, the entire contents of which are incorporated herein by reference.

BACKGROUND

Field

Embodiments described herein relate to a semiconductor memory device.

Description of the Related Art

There is known a semiconductor memory device that includes: a substrate; a plurality of gate electrodes arranged in a first direction intersecting a surface of the substrate; a semiconductor film extending in the first direction to face these plurality of gate electrodes; and a gate insulating film provided between the plurality of gate electrodes and the semiconductor film.

DETAILED DESCRIPTION

Figure 1:
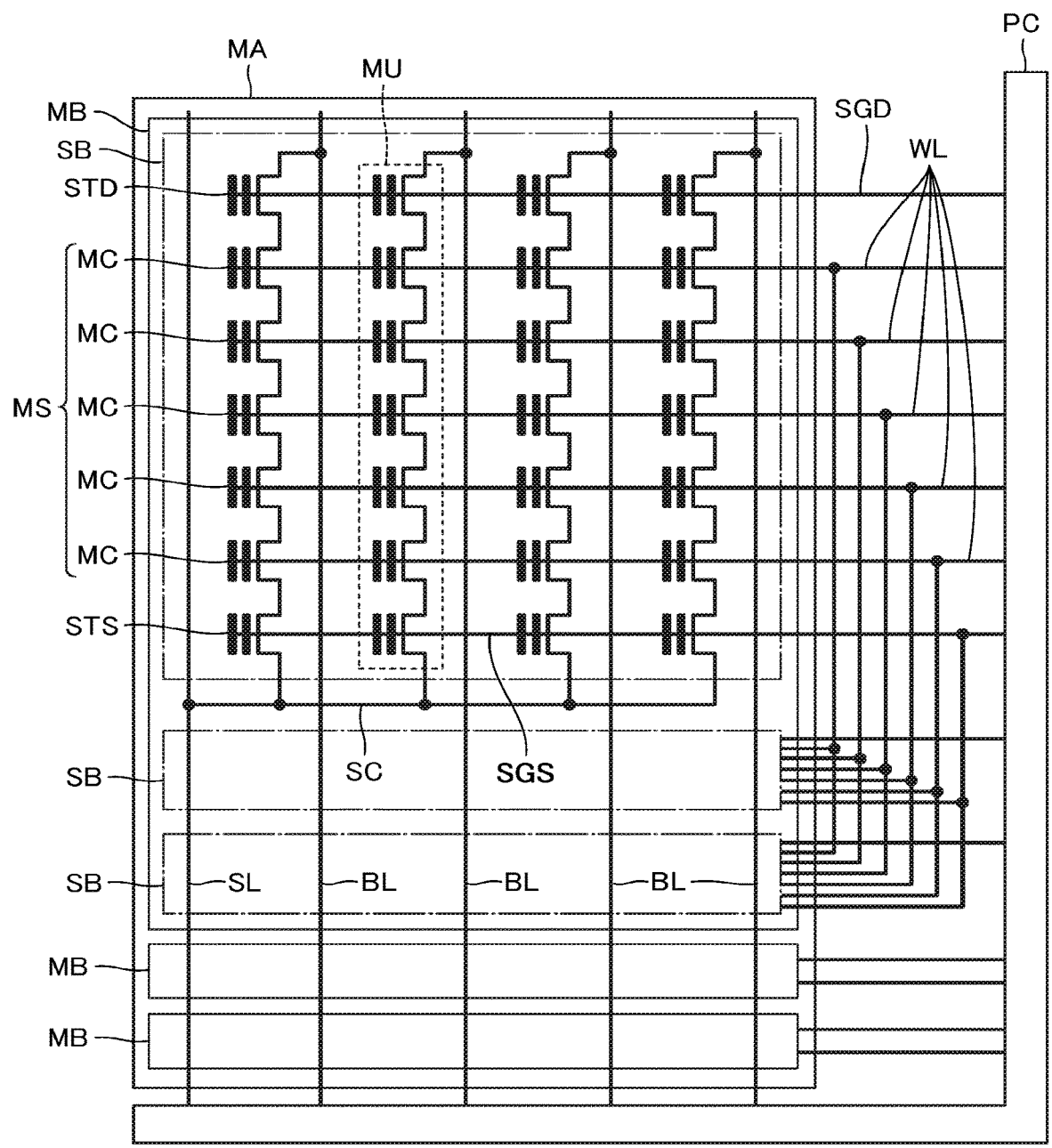
FIG. 1 is a schematic equivalent circuit diagram of a semiconductor memory device according to a first embodiment.

A semiconductor memory device according to one embodiment includes: a substrate; a plurality of first gate electrodes that are arranged in a first direction intersecting a surface of the substrate and extend in a second direction intersecting the first direction; a first semiconductor film that extends in the first direction and faces the plurality of first gate electrodes, a width in the second direction of one end on a substrate side of the first semiconductor film being smaller than a width in the second direction of an other end of the first semiconductor film; and a first gate insulating film that extends in the first direction and is provided between the plurality of first gate electrodes and the first semiconductor film. Moreover, this semiconductor memory device includes: a plurality of second gate electrodes that are arranged in the first direction, extend in the second direction, and are further from the substrate than the plurality of first gate electrodes are; a second semiconductor film that extends in the first direction and faces the plurality of second gate electrodes, a width in the second direction of one end on the substrate side of the second semiconductor film being smaller than the width in the second direction of the other end of the first semiconductor film, a width in the second direction of an other end of the second semiconductor film being larger than the width in the second direction of the one end of the second semiconductor film, and the one end of the second semiconductor film being connected to the other end of the first semiconductor film; and a second gate insulating film that extends in the first direction and is provided between the plurality of second gate electrodes and the second semiconductor film. Moreover, this semiconductor memory device includes: a third gate electrode that is provided between the plurality of first gate electrodes and the plurality of second gate electrodes, extends in the second direction, and faces the other end of the first semiconductor film at a surface on the substrate side; and a third gate insulating film that is provided between the third gate electrode and the other end of the first semiconductor film, and is connected to the first gate insulating film and the second gate insulating film. Moreover, the third gate electrode faces the second semiconductor film via the second gate insulating film, and faces the other end of the first semiconductor film via the third gate insulating film. Moreover, a thickness in the first direction of the third gate insulating film is larger than a thickness in the second direction of the first gate insulating film and the second gate insulating film.

Next, embodiments of a semiconductor memory device will be described in detail with reference to the drawings. Note that these embodiments are merely examples, and are not shown with the intention of limiting the present invention.

Moreover, in the present specification, a direction intersecting a surface of a substrate will be called a first direction, a direction intersecting the first direction will be called a second direction, and a direction intersecting the first direction and the second direction will be called a third direction. Moreover, a certain direction parallel to the surface of the substrate will be called an X direction, a direction parallel to the surface of the substrate and perpendicular to the X direction will be called a Y direction, and a direction perpendicular to the surface of the substrate will be called a Z direction. The X direction, the Y direction, and the Z direction may or may not each respectively correspond to any one of the first through third directions.

Moreover, in the present specification, expressions such as "up" or "down" will be defined with reference to the substrate. For example, an orientation of moving away from the substrate along the above-described first direction will be called up, and an orientation of coming closer to the substrate along the first direction will be called down. Moreover, when a lower surface or a lower end is referred to for a certain configuration, this will be assumed to mean a surface or end section on a substrate side of the configuration, and when an upper surface or an upper end is referred to for a certain configuration, this will be assumed to mean a surface or end section on an opposite side to the substrate of the configuration. Moreover, a surface intersecting the second direction or the third direction will be called a side surface, and so on.

Moreover, in the present specification, when a "radial direction" is referred to for the likes of a cylinder-shaped or ring-shaped member or a through-hole, this will be assumed to mean a direction of coming closer to a central axis of the cylinder or ring or a direction of moving away from the central axis of the cylinder or ring, in a plane perpendicular to this central axis. Moreover, when a "thickness in the radial direction", and so on, is referred to, this will be assumed to mean a difference between a distance from the central axis to an inner circumferential surface and a distance from the central axis to an outer circumferential surface, in such a plane.

Moreover, in the present specification, when a "width" or "thickness" in a certain direction is referred to for a configuration, a member, and so on, this will sometimes be assumed to mean a width or thickness in a cross section observed by the likes of SEM (Scanning Electron Microscopy) or TEM (Transmission Electron Microscopy), and so on.

First Embodiment

Configuration

FIG. 1 is a schematic equivalent circuit diagram of a semiconductor memory device according to a first embodiment. For convenience of description, part of a configuration is omitted in FIG. 1.

The semiconductor memory device according to the present embodiment includes: a memory cell array MA; and a peripheral circuit PC that controls the memory cell array MA.

The memory cell array MA includes a plurality of memory blocks MB. These plurality of memory blocks MB each include a plurality of sub-blocks SB. These plurality of sub-blocks SB each include a plurality of memory units MU. One ends of these plurality of memory units MU are respectively connected to the peripheral circuit PC via bit lines BL. Moreover, the other ends of these plurality of memory units MU are each connected to the peripheral circuit PC via a common lower wiring SC and common source line SL.

The memory unit MU includes a drain select transistor STD, a memory string MS, and a source select transistor STS that are connected in series between the bit line BL and the lower wiring SC. Hereafter, the drain select transistor STD and the source select transistor STS will sometimes simply be called select transistors (STD, STS).

The memory string MS includes a plurality of memory cells MC connected in series. The memory cell MC is a field effect transistor that includes a semiconductor film, a gate insulating film, and a gate electrode. The semiconductor film functions as a channel region. The gate insulating film includes a memory section capable of storing data. This memory section is a charge accumulating film such as a silicon nitride film (SiN) or a floating gate, for example. In this case, a threshold voltage of the memory cell MC changes according to an amount of charge in the charge accumulating film. The gate electrode is connected to a word line WL. The word lines WL are provided corresponding to the plurality of memory cells MC belonging to one memory string MS, and are commonly connected to all of the memory strings MS in one memory block MB.

The select transistor (STD, STS) is a field effect transistor that includes a semiconductor film, a gate insulating film, and a gate electrode. The semiconductor film functions as a channel region. The gate electrode of the drain select transistor STD is connected to a drain select line SGD. The drain select line SGD is provided corresponding to the sub-block SB and is commonly connected to all of the drain select transistors STD in one sub-block SB. The gate electrode of the source select transistor STS is connected to a source select line SGS. The source select line SGS is commonly connected to all of the source select transistors STS in one memory block MB.

The peripheral circuit PC generates a voltage required for a read operation, a write operation, and an erase operation, and applies the voltage to the bit line BL, the source line SL, the word line WL, and the select gate line (SGD, SGS), for example. The peripheral circuit PC includes a plurality of transistors and wirings provided on the same chip as the memory cell array MA, for example.

Figure 2:
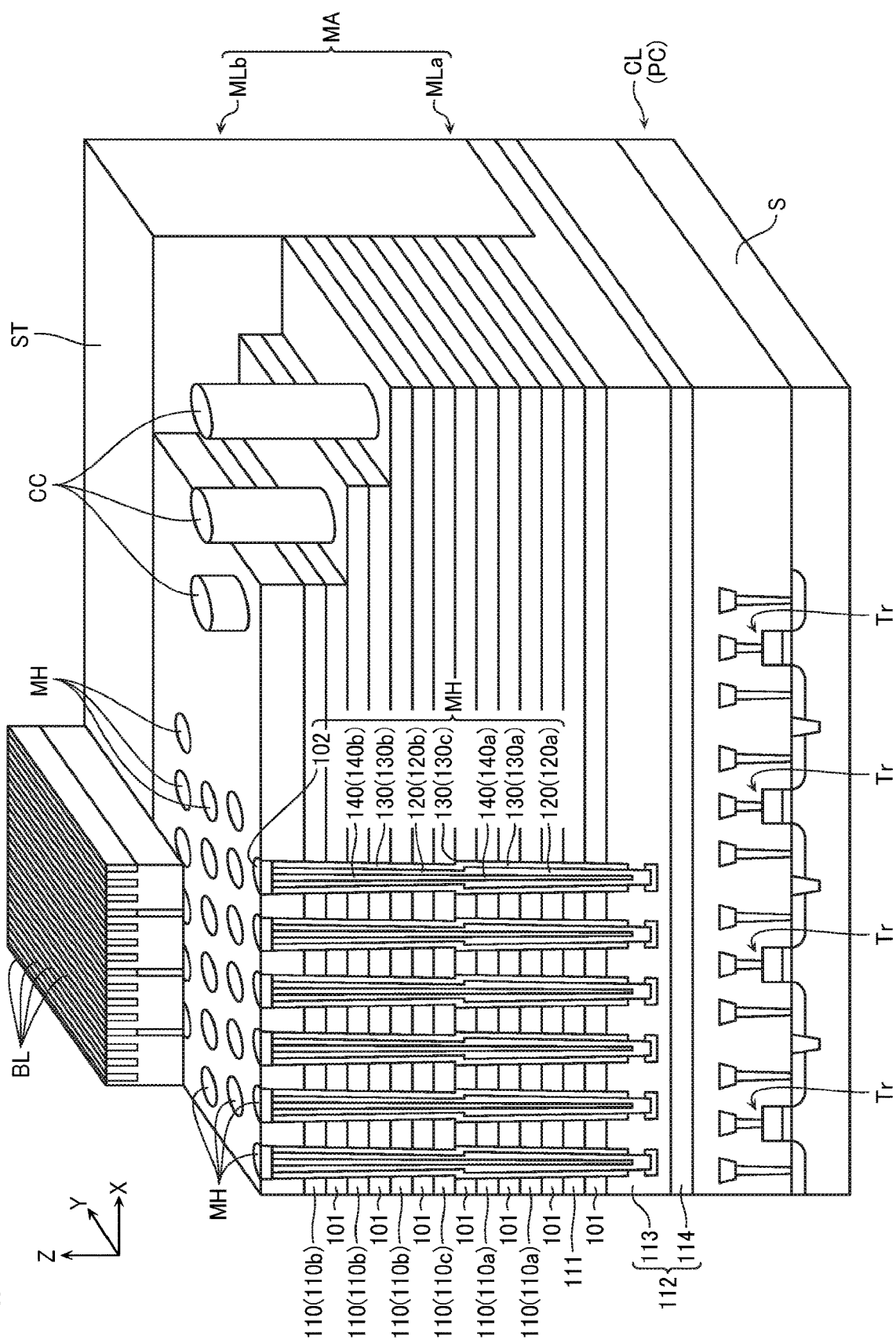
FIG. 2 is a schematic perspective view showing a configuration of part of same semiconductor memory device.

FIG. 2 is a schematic perspective view of the semiconductor memory device according to the present embodiment. For convenience of description, part of a configuration is omitted in FIG. 2.

As shown in FIG. 2, the semiconductor memory device according to the present embodiment includes: a substrate S; a circuit layer CL provided above the substrate S; and the memory cell array MA provided above the circuit layer CL. Moreover, the memory cell array MA includes: a memory layer MLa; and a memory layer MLb provided above the memory layer MLa.

The substrate S is a semiconductor substrate configured from the likes of single crystal silicon (Si), for example. The substrate S has a double well structure in which, for example, an n type impurity layer is included in a surface of the semiconductor substrate, and a p type impurity layer is further included in this n type impurity layer.

The circuit layer CL includes: a plurality of transistors Tr; and a plurality of wirings and contacts connected to these plurality of transistors Tr, that, together with the plurality of transistors Tr, configure the peripheral circuit PC (FIG. 1). The transistor Tr is a field effect transistor that utilizes as a channel region the surface of the substrate S, for example.

The memory cell array MA includes: a plurality of conductive films 110 arranged in the Z direction; a plurality of semiconductor films 120 extending in the Z direction to face the plurality of conductive films 110; and a gate insulating film 130 provided between these conductive films 110 and semiconductor films 120.

The conductive film 110 functions as the word line WL (FIG. 1) and the gate electrodes of the plurality of memory cells MC connected to this word line WL, or as the drain select line SGD (FIG. 1) and the gate electrodes of the plurality of drain select transistors STD (FIG. 1) connected to this drain select line SGD. Moreover, a conductive film 111 and a conductive film 112 are provided below the plurality of conductive films 110. The conductive film 111 functions as the source select line SGS (FIG. 1) and the gate electrodes of the plurality of source select transistors STS (FIG. 1) connected to this source select line SGS. The conductive film 112 functions as the lower wiring SC (FIG. 1). Moreover, an interlayer insulating film 101 of the likes of silicon oxide (SiO$_2$) is provided between the conductive films 110, 111, 112.

The conductive films 110, 111 include a plurality of through-holes formed in a certain pattern, and the semiconductor film 120 and gate insulating film 130 are disposed inside this through-hole. End sections in the X direction of the conductive films 110, 111 are connected to contacts CC that extend in the Z direction.

The conductive film 112 includes: a semiconductor film 113 connected to the semiconductor film 120; and a conductive film 114 provided on a lower surface of the semiconductor film 113. The semiconductor film 113 is a conductive semiconductor film of the likes of polycrystalline silicon (Si) implanted with an n type impurity such as phosphorus (P), for example. The conductive film 114 is, for example, a conductive film of polycrystalline silicon implanted with an n type impurity such as phosphorus, a conductive film of a metal such as tungsten (W), or a conductive film of a silicide, and so on.

Hereafter, a conductive film 110 included in the memory layer MLa, of the plurality of conductive films 110 will sometimes be written as "conductive film 110a", or the like. Moreover, a conductive film 110 included in the memory layer MLb, of the plurality of conductive films 110 will sometimes be written as "conductive film 110b", or the like. Moreover, a conductive film 110 positioned between the conductive film 110a and the conductive film 110b, of the plurality of conductive films 110 will sometimes be written as "conductive film 110c", or the like.

The semiconductor film 120 functions as the channel regions of the plurality of memory cells MC, the drain select transistor STD, and the source select transistor STS that are arranged in the Z direction, and so on. The semiconductor film 120 is a semiconductor film of the likes of non-doped polycrystalline silicon, for example. Moreover, an insulating film 140 of silicon dioxide (SiO$_2$) or the like is embedded in a central portion of the semiconductor film 120.

Hereafter, a semiconductor film 120 and insulating film 140 included in the memory layer MLa, of the plurality of semiconductor films 120 and insulating films 140 will sometimes be written as "semiconductor film 120a" and "insulating film 140a", or the like. Moreover, a semiconductor film 120 and insulating film 140 included in the memory layer MLb, of the plurality of semiconductor films 120 and insulating films 140 will sometimes be written as "semiconductor film 120b" and "insulating film 140b", or the like.

The semiconductor films 120a, 120b each have a substantially cylindrical shape extending in the Z direction. Moreover, outer diameters of the semiconductor films 120a, 120b become smaller as the substrate is approached. Therefore, outer diameters of lower end sections of the semiconductor films 120a, 120b are respectively smaller than outer diameters of upper end sections of the semiconductor films 120a, 120b. The semiconductor film 120a is connected at its lower end section to the semiconductor film 113, and is connected at its upper end section to the semiconductor film 120b. The semiconductor film 120b is connected at its upper end section to a semiconductor film 102, and is connected to the bit line BL via this semiconductor film 102. The semiconductor film 102 is a conductive semiconductor film of the likes of polycrystalline silicon implanted with an n type impurity such as phosphorus, for example.

The gate insulating film 130 is a gate insulating film that includes, for example, the likes of a charge accumulating film of silicon nitride (Si$_3$N$_4$), and so on.

Hereafter, a gate insulating film 130 included in the memory layer MLa, of the gate insulating films 130 will sometimes be written as "gate insulating film 130a", or the like. Moreover, a gate insulating film 130 included in the memory layer MLb, of the gate insulating films 130 will sometimes be written as "gate insulating film 130b", or the like. Moreover, a gate insulating film 130 positioned between the memory layers MLa, MLb, of the gate insulating films 130 will sometimes be written as "gate insulating film 130c", or the like.

The gate insulating films 130a, 130b each have a substantially cylindrical shape extending in the Z direction. Moreover, outer diameters of the gate insulating films 130a, 130b become smaller as a lower side is approached. Therefore, outer diameters of lower end sections of the gate insulating films 130a, 130b are respectively smaller than outer diameters of upper end sections of the gate insulating films 130a, 130b.

The gate insulating film 130c has a substantially disk-like or substantially ring-like shape including a through-hole. An outer circumferential portion of the gate insulating film 130c is connected to the upper end section of the gate insulating film 130a. Moreover, an inner circumferential portion of the through-hole of the gate insulating film 130c is connected to the lower end section of the gate insulating film 130b.

Hereafter, a substantially circular column shaped configuration including the likes of the semiconductor films 120a, 120b, the gate insulating films 130a, 130b, 130c, the insulating films 140a, 140b, and the semiconductor film 102 will sometimes be written as "memory structure MH", or the like.

Figure 3:
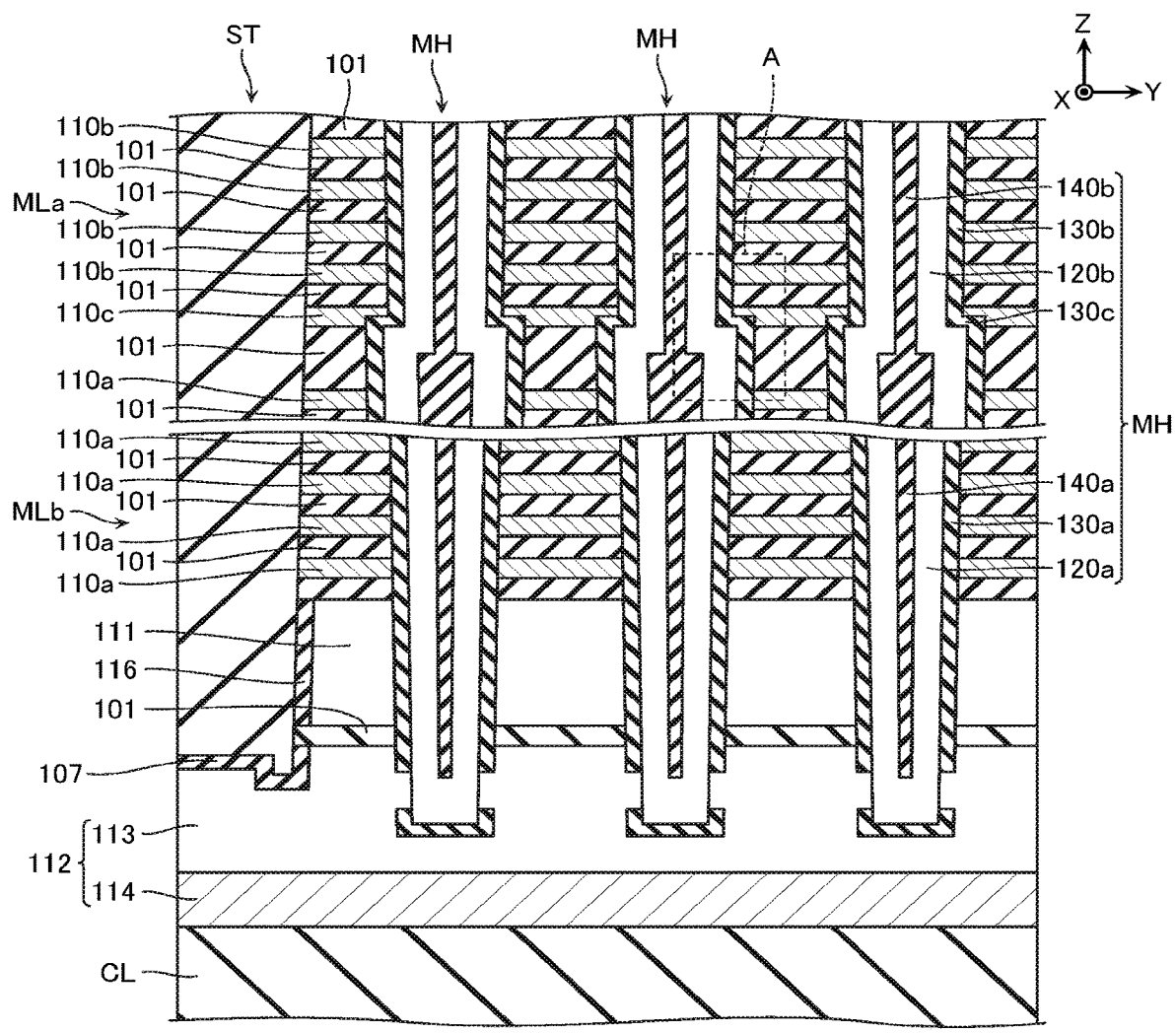
FIG. 3 is a schematic cross-sectional view showing a configuration of part of same semiconductor memory device.
Figure 4:
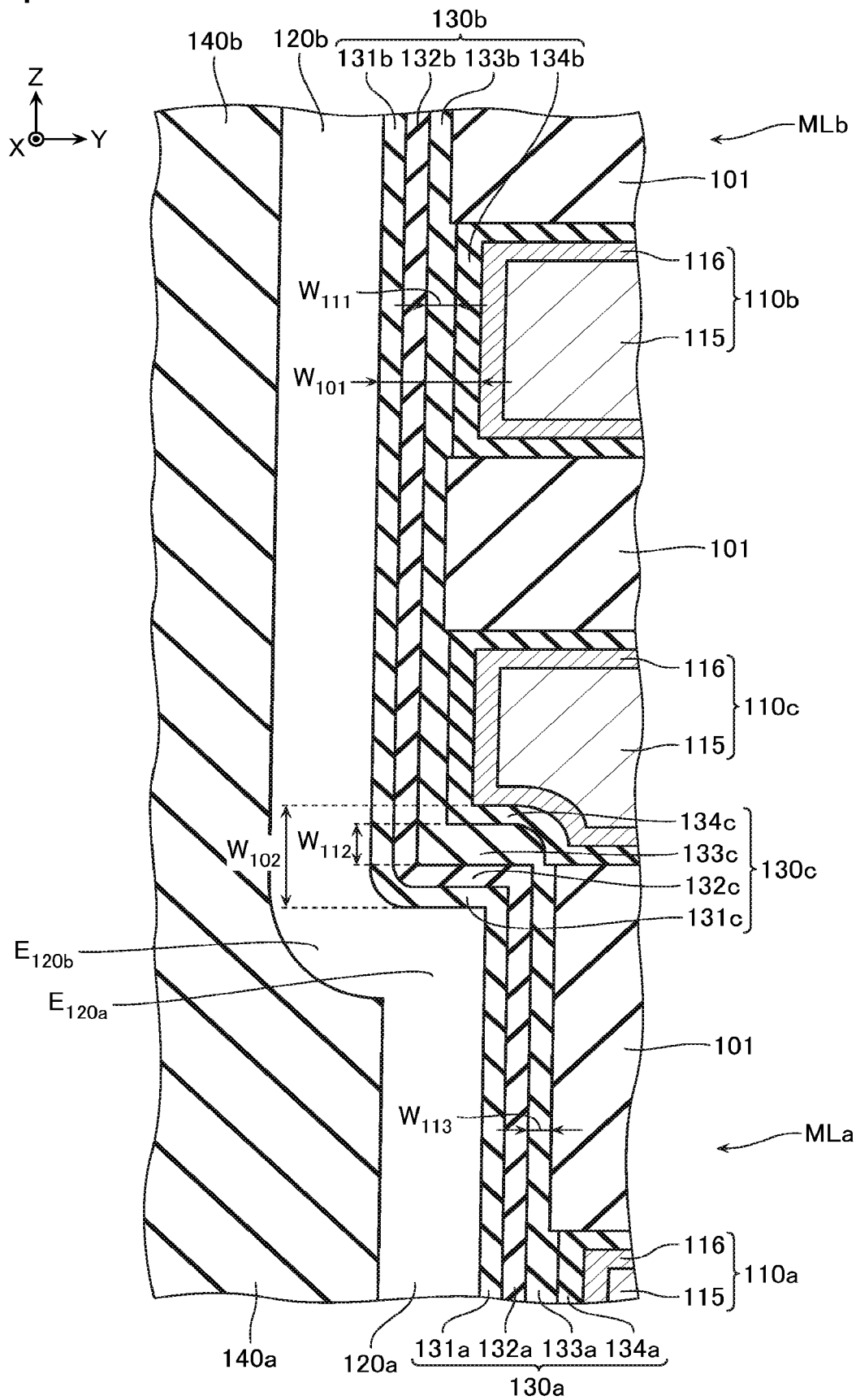
FIG. 4 is an enlarged view of a portion indicated by A of FIG. 3.

FIG. 3 is a schematic YZ cross-sectional view showing a more specific configuration example of a structure exemplified in FIG. 2. FIG. 4 is a schematic enlarged view of a portion indicated by A of FIG. 3. Note that for convenience of description, part of a configuration is omitted in FIGS. 3 and 4.

As shown in FIG. 4, the conductive films 110a, 110b, 110c each include: a metal film 115 of tungsten (W) or the like; and a barrier metal film 116 of titanium nitride (TiN) or the like provided on an upper surface and a lower surface of this metal film 115 and on an inner circumferential surface of a through-hole of the metal film 115. Note that the inner circumferential surface of the conductive film 110c faces an outer circumferential surface of the semiconductor film 120b via the gate insulating film 130b. Moreover, part of a lower surface of the conductive film 110c faces an upper end section $E_{120a}$ of the semiconductor film 120a via the gate insulating film 130c.

As mentioned above, the upper end section $E_{120a}$ of the semiconductor film 120a is connected to a lower end section $E_{120b}$ of the semiconductor film 120b. As illustrated, a level difference is formed in this connecting portion.

The gate insulating films 130a, 130b, 130c respectively include tunnel insulating films 131a, 131b, 131c of silicon oxide or the like, charge accumulating films 132a, 132b, 132c of silicon nitride or the like, block insulating films 133a, 133b, 133c of silicon oxide or the like, and parts of high-permittivity insulating films 134a, 134b, 134c of alumina ($Al_2O_3$) or the like. The tunnel insulating films 131a, 131b, the charge accumulating films 132a, 132b, and the block insulating films 133a, 133b extend in the Z direction. The tunnel insulating film 131c, the charge accumulating film 132c, and the block insulating film 133c each extend in the X direction and the Y direction, and are respectively connected to upper end sections of the tunnel insulating film 131a, the charge accumulating film 132a, and the block insulating film 133a, and lower end sections of the tunnel insulating film 131b, the charge accumulating film 132b, and the block insulating film 133b. A plurality of the high-permittivity insulating films 134a, 134b, 134c are provided corresponding to the conductive films 110, and the high-permittivity insulating films 134a, 134b, 134c each cover an upper surface and a lower surface of the conductive film 110, and an inner circumferential surface of a through-hole of the conductive film 110.

Now, in the present embodiment, a thickness $W_{102}$ in the Z direction of the gate insulating film 130c is larger than a thickness $W_{101}$ in the radial direction of the gate insulating films 130a, 130b. Therefore, a shortest distance from the upper end section $E_{120a}$ of the semiconductor film 120a to the conductive film 110c is larger than a shortest distance from the semiconductor film 120a to the conductive film 110a, and is larger than a shortest distance from the semiconductor film 120b to the conductive film 110b.

Moreover, in the present embodiment, a thickness $W_{112}$ in the Z direction of the block insulating film 133c is larger than a thickness $W_{111}$ in the radial direction of the block insulating films 133a, 133b. Note that the block insulating films 133a, 133b are provided also on an inner circumferential surface of a through-hole of the interlayer insulating film 101. A thickness $W_{113}$ in the radial direction of this portion is smaller than the thickness $W_{111}$ in the radial direction of portions provided in the through-holes of the conductive films 110a, 110b.

Note that thicknesses in the Z direction of the tunnel insulating film 131c, the charge accumulating film 132c, and the high-permittivity insulating film 134c are respectively of the same degree as thicknesses in the radial direction of the tunnel insulating films 131a, 131b, the charge accumulating films 132a, 132b, and the high-permittivity insulating films 134a, 134b. At least, a difference between the above-described thickness $W_{112}$ and the above-described thickness $W_{111}$ is larger than differences between the thicknesses in the Z direction of the tunnel insulating film 131c, the charge accumulating film 132c, and the high-permittivity insulating film 134c, and the thicknesses in the radial direction of the tunnel insulating films 131a, 131b, the charge accumulating films 132a, 132b, and the high-permittivity insulating films 134a, 134b. The same applies also to a difference between the above-described thickness $W_{113}$ and the above-described thickness $W_{111}$.

In the description below, the tunnel insulating films 131a, 131b, 131c will sometimes be collectively called a tunnel insulating film 131. Similarly, the charge accumulating films 132a, 132b, 132c will sometimes be collectively called a charge accumulating film 132. Similarly, the block insulating films 133a, 133b, 133c will sometimes be collectively called a block insulating film 133. Similarly, the high-permittivity insulating films 134a, 134b, 134c will sometimes be collectively called a high-permittivity insulating film 134.

Method of Manufacturing

Next, a method of manufacturing the semiconductor memory device according to the present embodiment will be described with reference to FIGS. 5-22.

Figure 5:
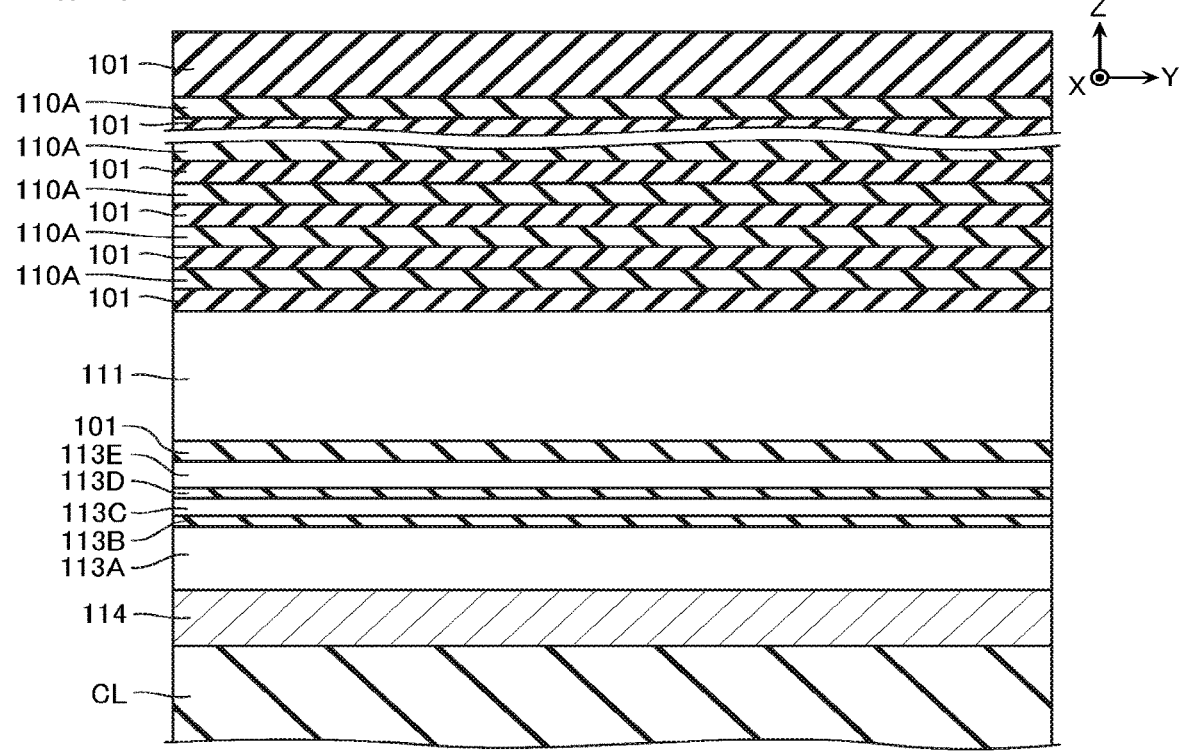
FIG. 5 is a schematic cross-sectional view showing a method of manufacturing same semiconductor memory device.

As shown in FIG. 5, in same method of manufacturing, above the circuit layer CL, the conductive film 114, a semiconductor film 113A of silicon or the like, an insulating film 113B of silicon oxide or the like, a semiconductor film 113C of silicon or the like, an insulating film 113D of silicon oxide or the like, and a semiconductor film 113E of silicon or the like, are formed. Moreover, above these, the interlayer insulating film 101 and the conductive film 111 are formed. Moreover, above these, a plurality of the interlayer insulating films 101 and sacrifice films 110A of silicon nitride or the like, that correspond to the memory layer MLa, are alternately formed. This step is performed by a method such as PECVD (Plasma-Enhanced Chemical Vapor Deposition), for example.

Figure 6:
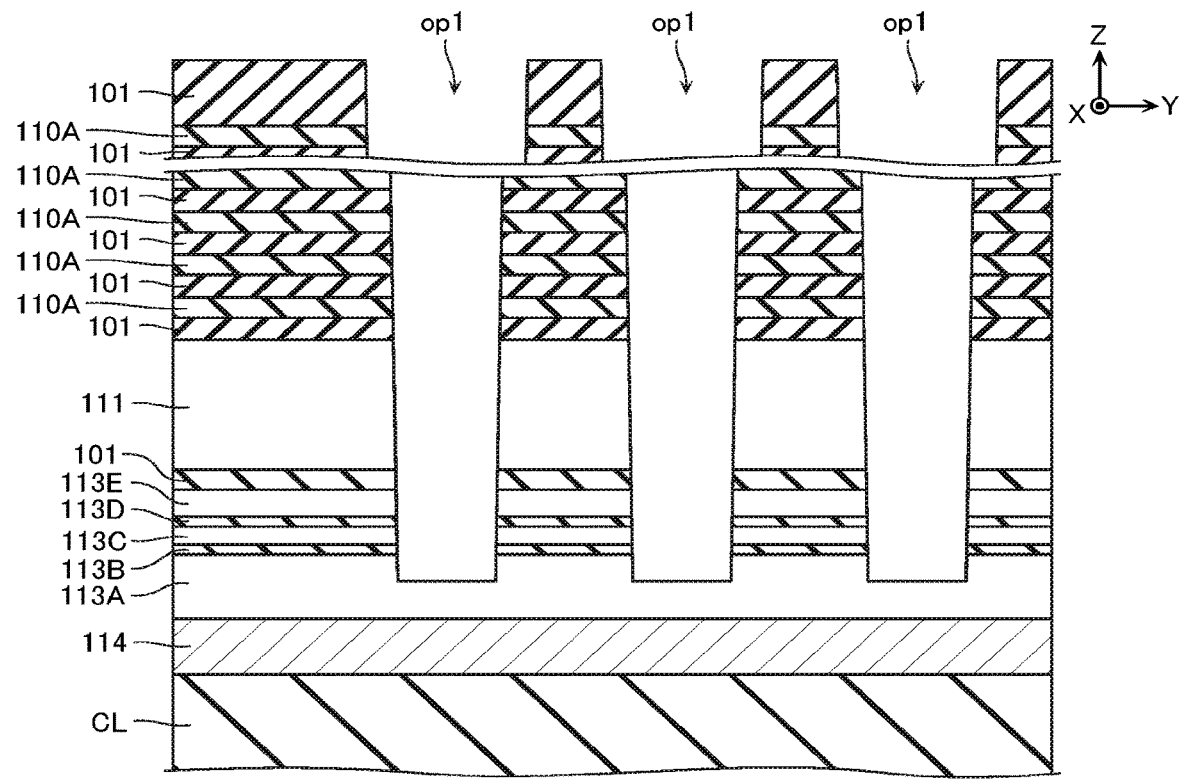
FIG. 6 is a schematic cross-sectional view showing same method of manufacturing.

Next, as shown in FIG. 6, an opening op1 is formed. The opening op1 is an opening that extends in the Z direction and penetrates the sacrifice films 110A, the interlayer insulating films 101, the conductive film 111, the semiconductor film 113E, the insulating film 113D, the semiconductor film 113C, and the insulating film 113B to expose the semiconductor film 113A. This step is performed by a method such as RIE (Reactive Ion Etching), for example.

Figure 7:
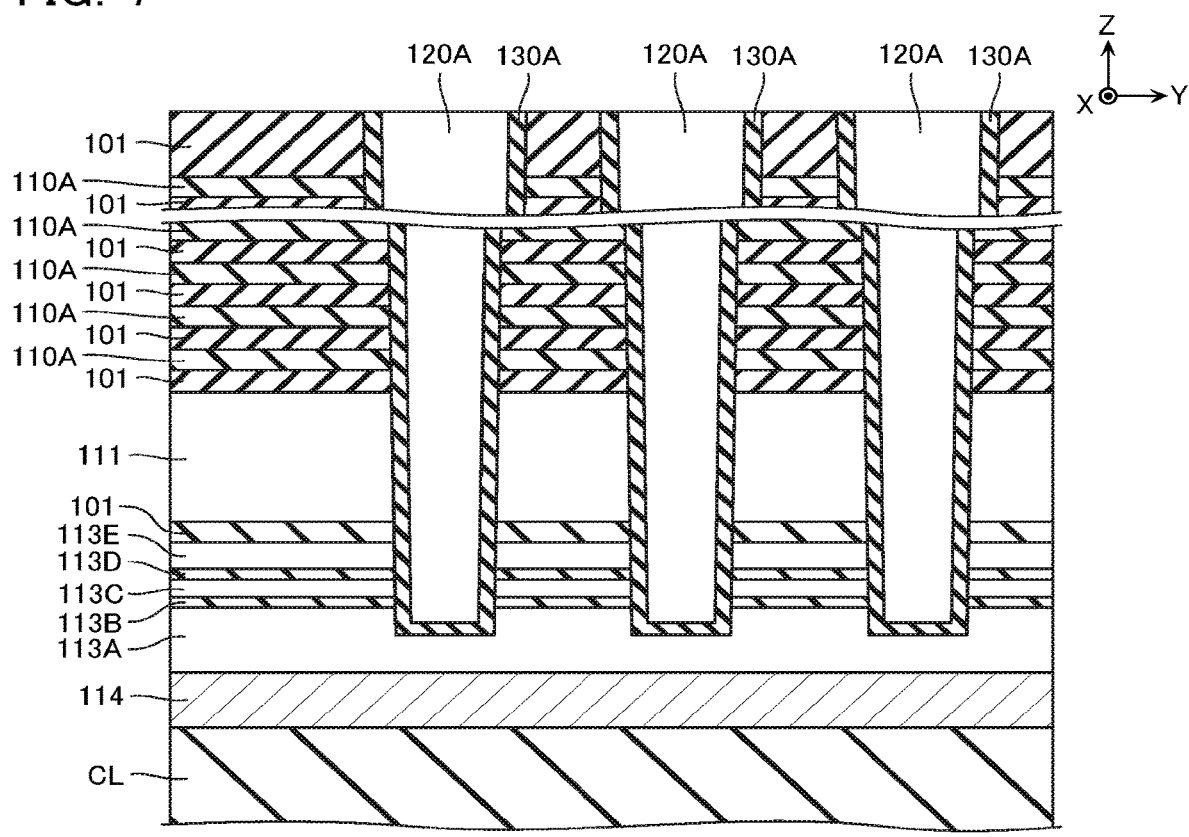
FIG. 7 is a schematic cross-sectional view showing same method of manufacturing.

Next, as shown in FIG. 7, a cover film 130A of silicon nitride or the like and a sacrifice film 120A of silicon or the like, are formed on an inside of the opening op1. This step is performed by, for example, forming the cover film 130A and the sacrifice film 120A by LPCVD (Low-Pressure Chemical Vapor Deposition) or the like, and exposing an upper surface of an uppermost level interlayer insulating film 101 by RIE or the like.

Figure 8:
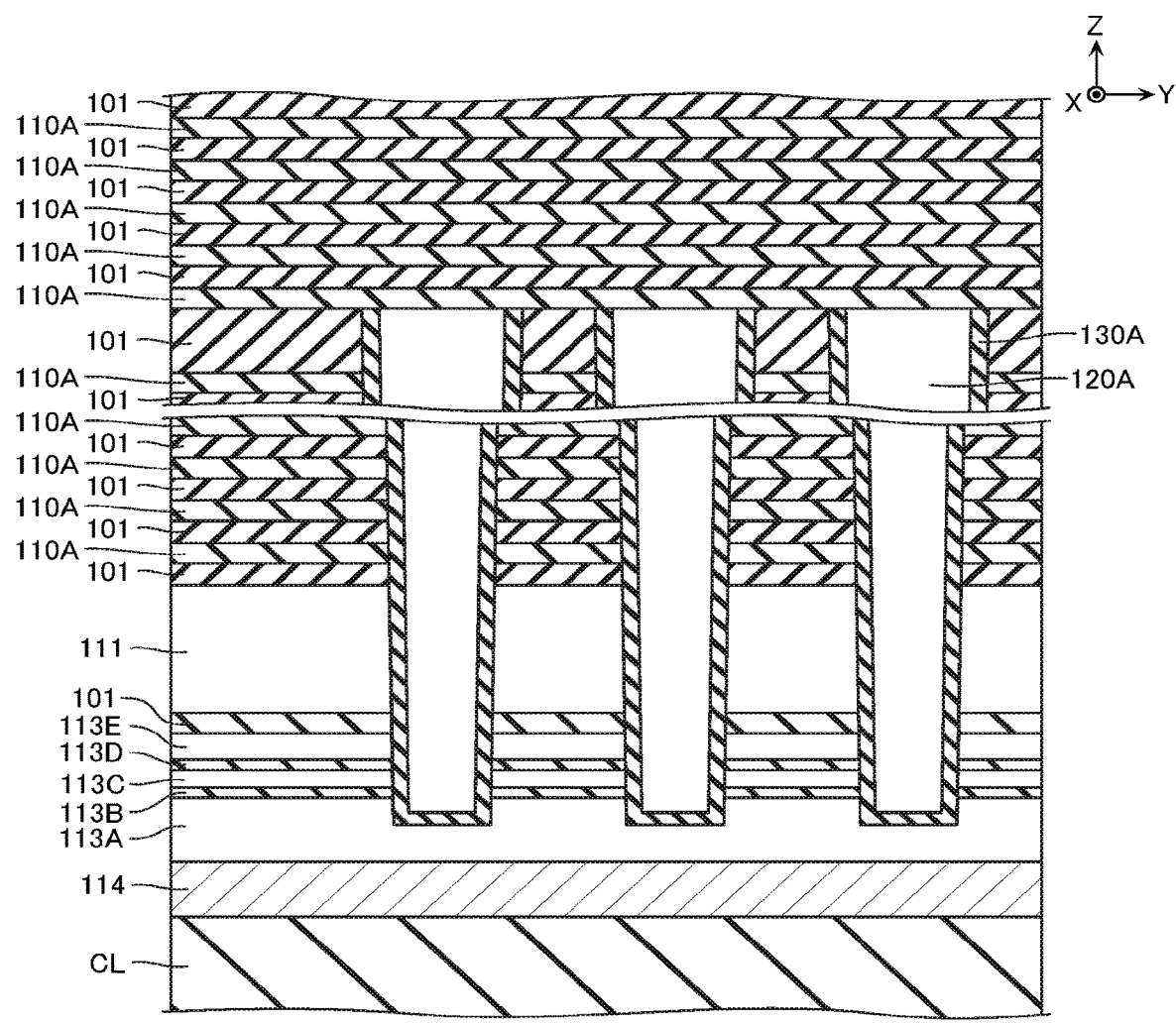
FIG. 8 is a schematic cross-sectional view showing same method of manufacturing.

Next, as shown in FIG. 8, a plurality of the interlayer insulating films 101 and the sacrifice films 110A that correspond to the memory layer MLb, are alternately formed. This step is performed by a method such as PECVD, for example.

Figure 9:
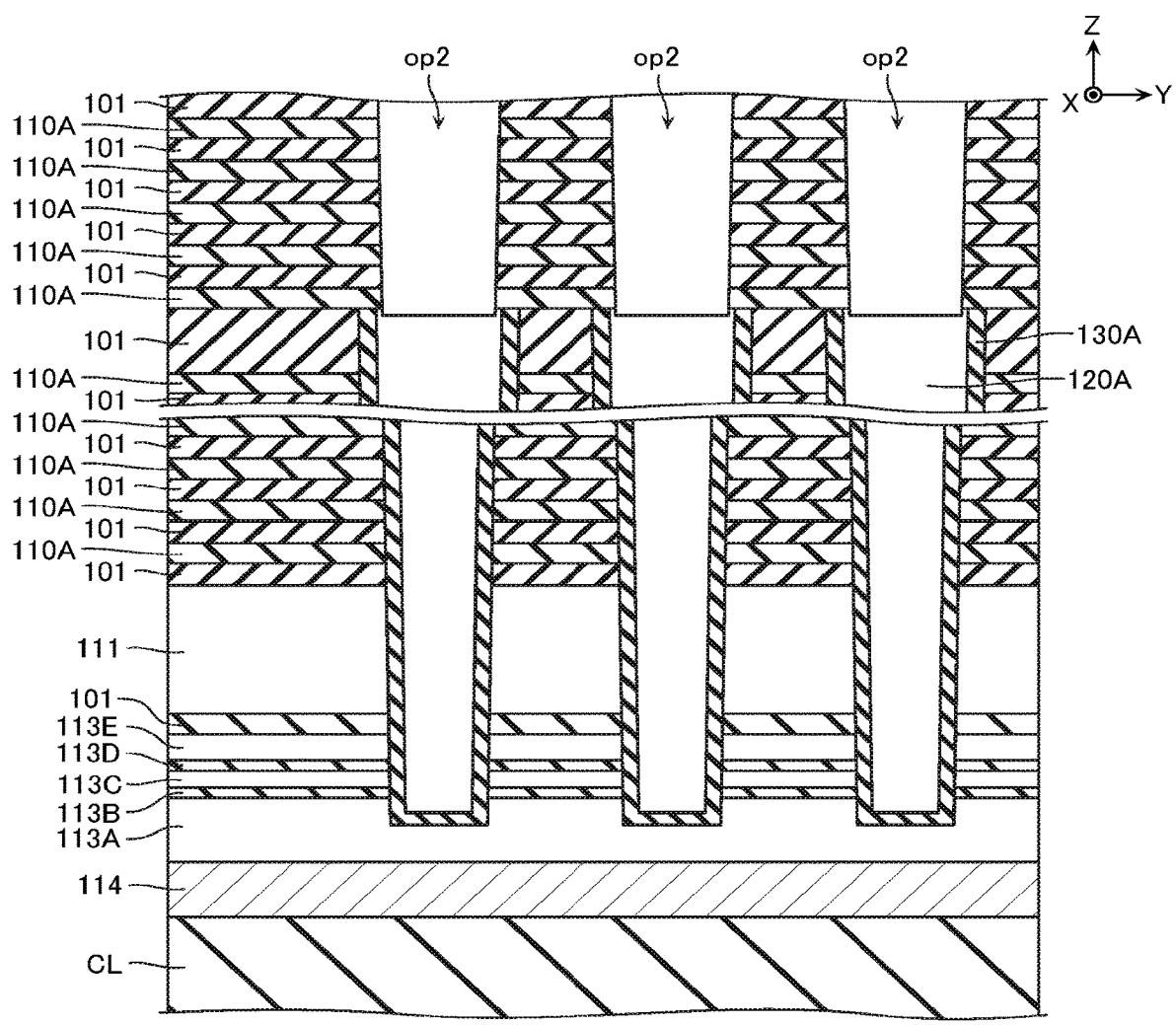
FIG. 9 is a schematic cross-sectional view showing same method of manufacturing.
Figure 10:
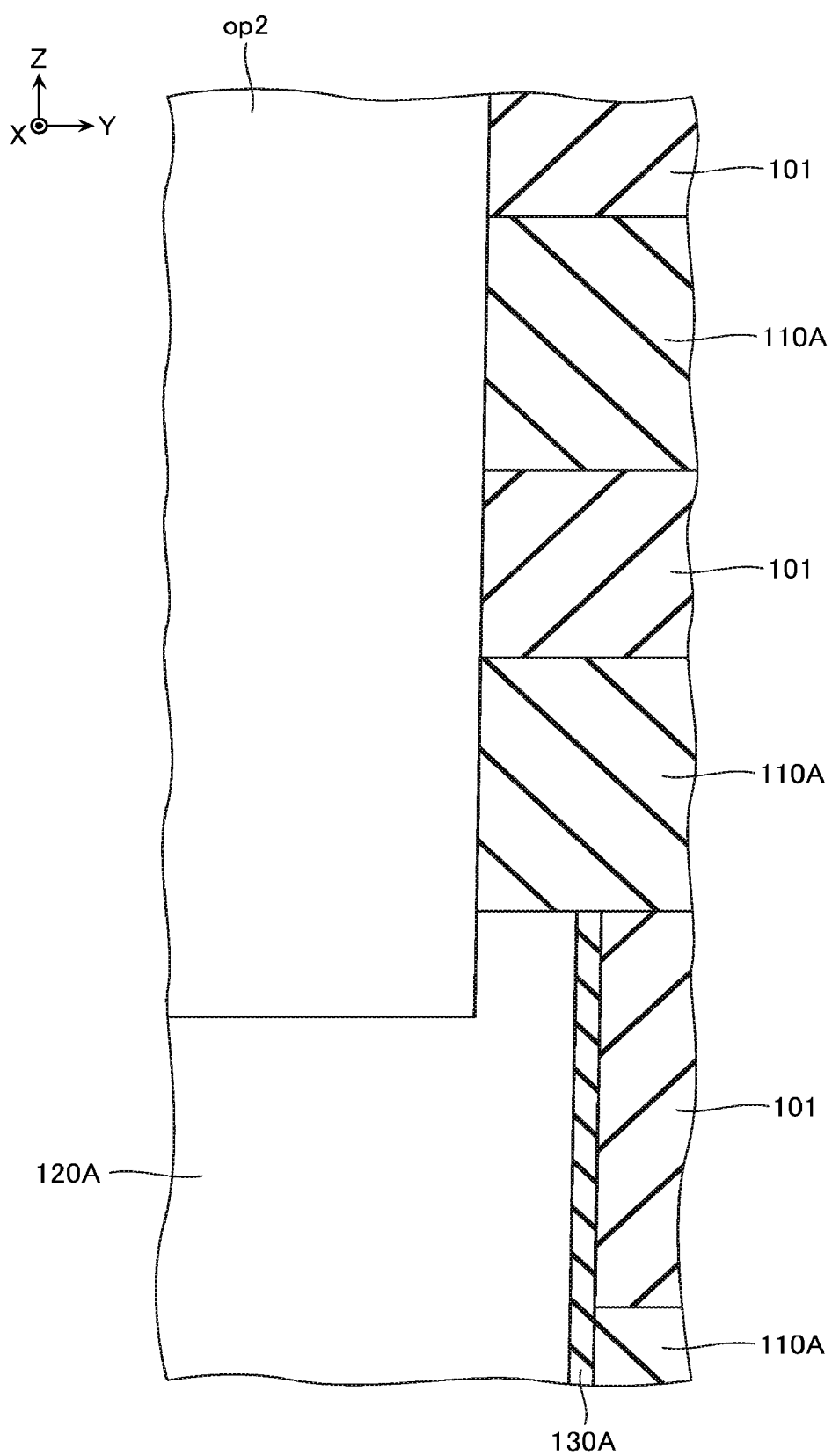
FIG. 10 is a schematic cross-sectional view showing same method of manufacturing.

Next, as shown in FIGS. 9 and 10, an opening op2 is formed. The opening op2 is an opening that extends in the Z direction and penetrates the sacrifice films 110A and the interlayer insulating films 101 to expose the sacrifice film 120A. This step is performed by a method such as RIE, for example.

Figure 11:
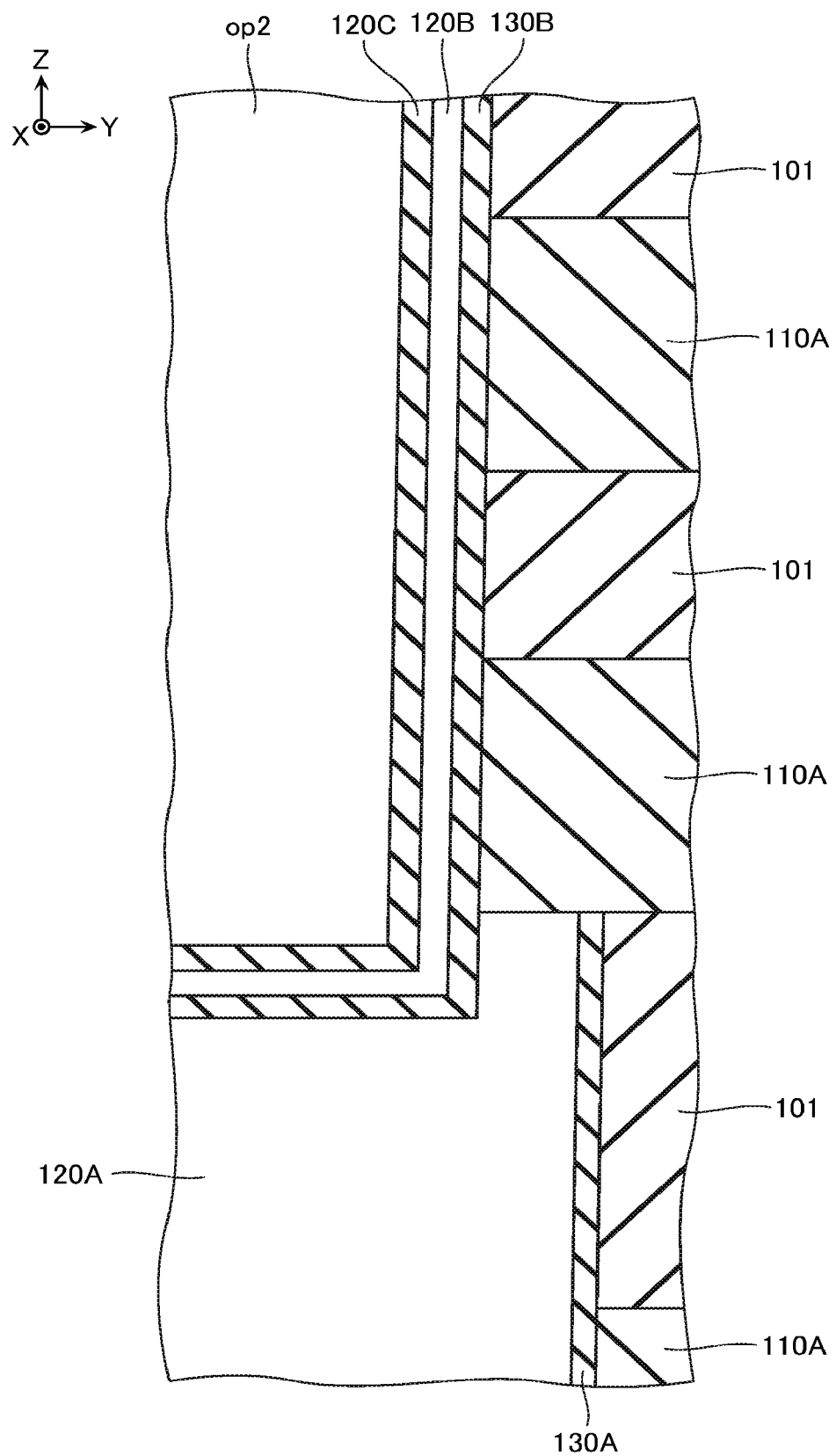
FIG. 11 is a schematic cross-sectional view showing same method of manufacturing.

Next, as shown in FIG. 11, a cover film 130B of silicon nitride or the like, a sacrifice film 120B of silicon or the like, and a cover film 120C of silicon oxide or the like, are formed on an inner circumferential surface and a bottom surface of the opening op2. This step is performed by a method such as LPCVD, for example.

Figure 12:
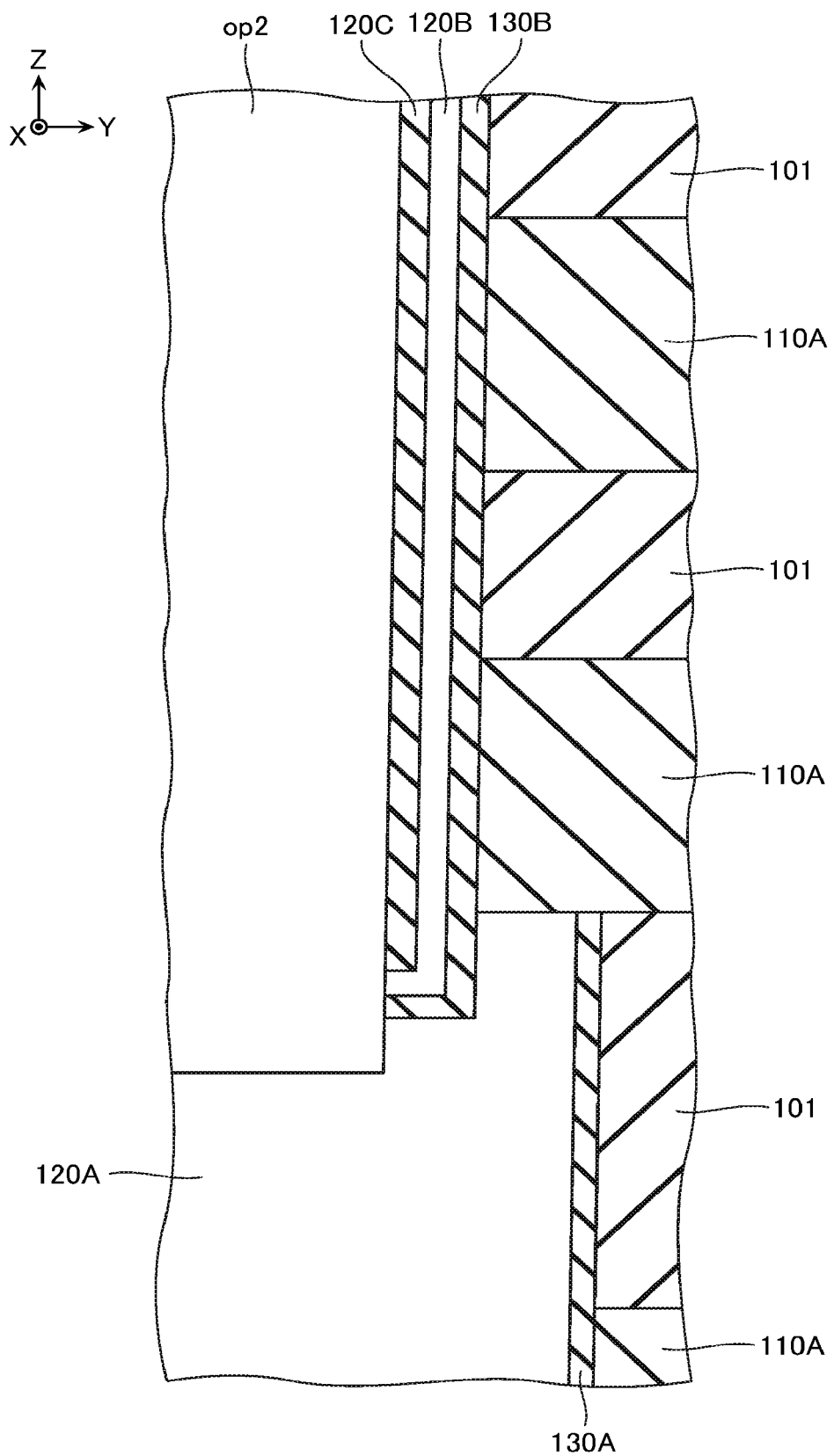
FIG. 12 is a schematic cross-sectional view showing same method of manufacturing.

Next, as shown in FIG. 12, portions formed on the bottom surface of the opening op2, of the cover film 130B, the sacrifice film 120B, and the cover film 120C, are removed. This step is performed by a method such as RIE, for example.

Figure 13:
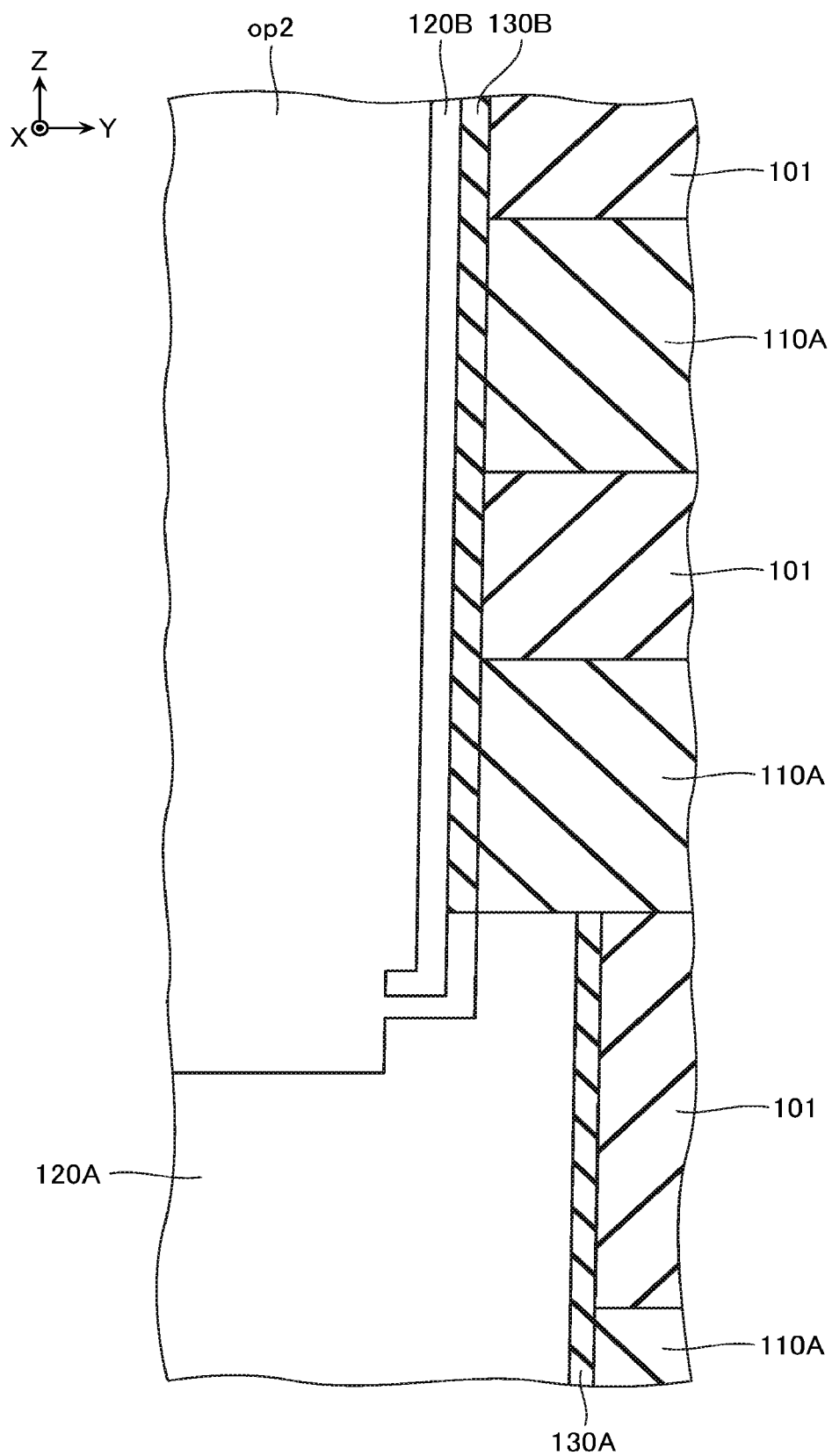
FIG. 13 is a schematic cross-sectional view showing same method of manufacturing.

Next, as shown in FIG. 13, the cover film 120C is removed. In addition, part of the cover film 130B is removed. In the example illustrated, the cover film 130B is removed leaving a portion covering a side surface of the sacrifice film 110A corresponding to the conductive film 110c. This step is performed by a method such as wet etching, for example.

Figure 14:
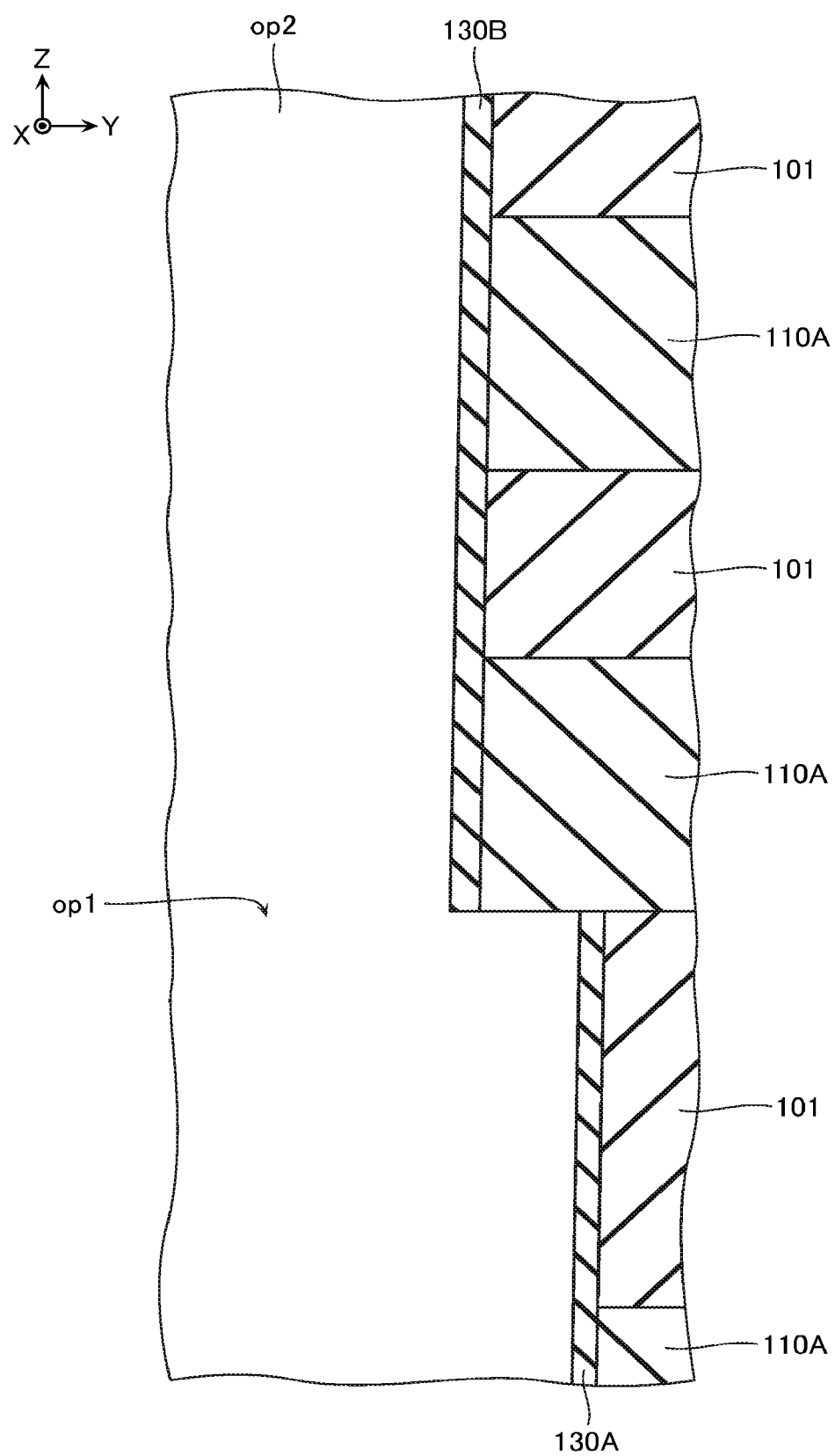
FIG. 14 is a schematic cross-sectional view showing same method of manufacturing.

Next, as shown in FIG. 14, the sacrifice film 120A and the sacrifice film 120B are removed. This step is performed by a method such as wet etching, for example.

Figure 15:
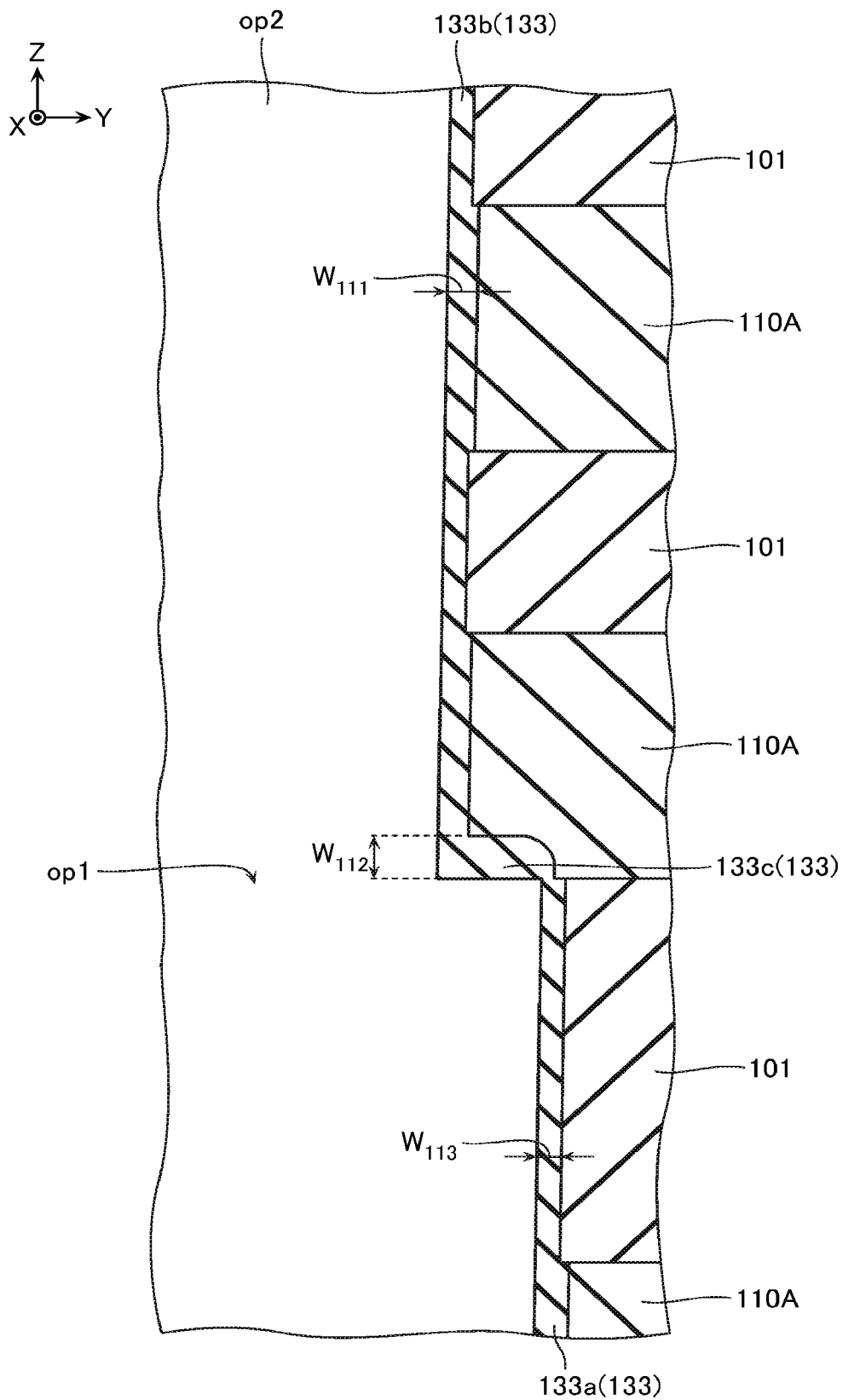
FIG. 15 is a schematic cross-sectional view showing same method of manufacturing.
Figure 16:
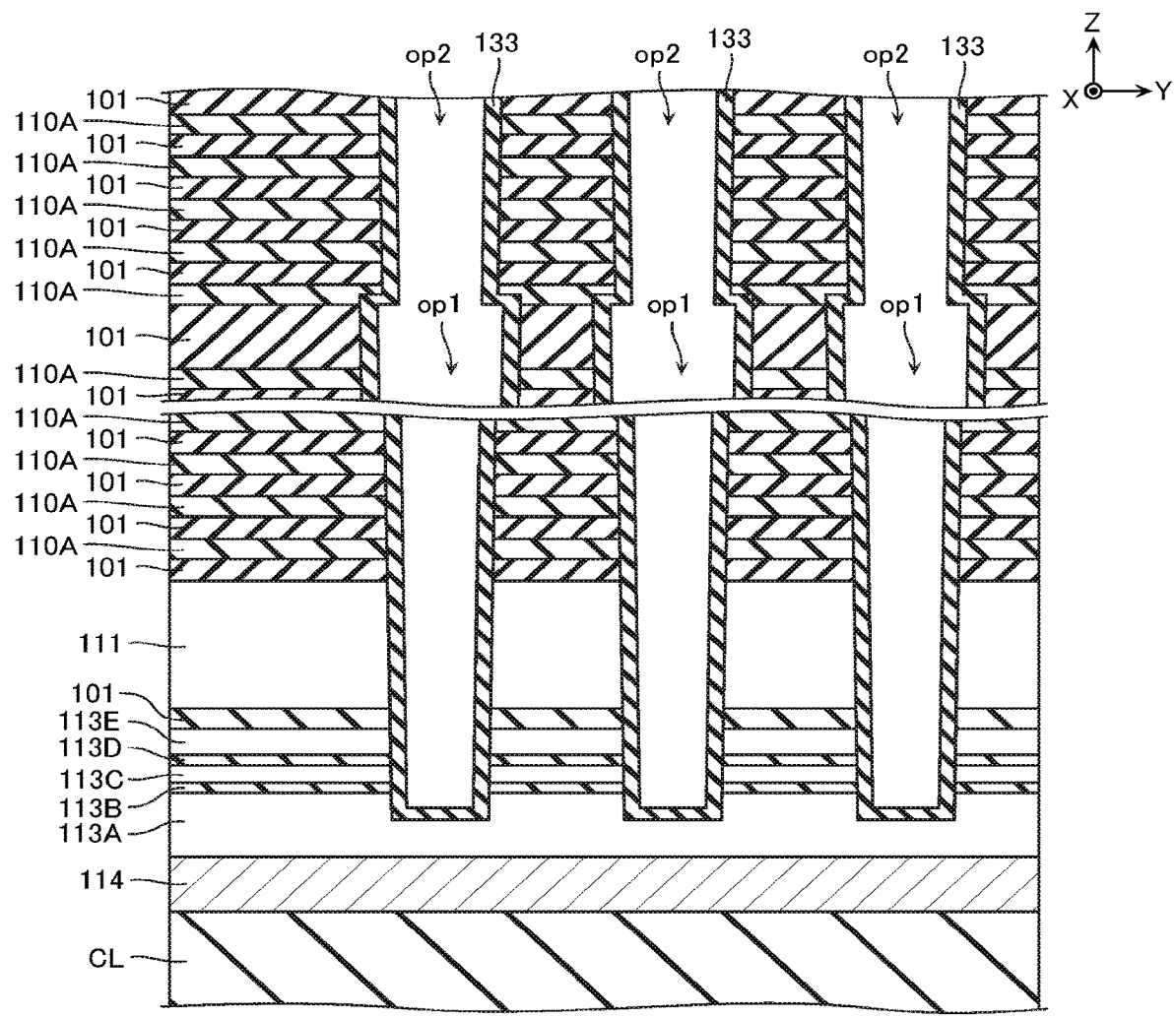
FIG. 16 is a schematic cross-sectional view showing same method of manufacturing.

Next, as shown in FIGS. 15 and 16, the block insulating film 133 is formed. This step is performed by, for example, performing oxidation treatment on the cover film 130A, the cover film 130B, and part of the sacrifice film 110A.

Now, in the present embodiment, the sacrifice films 110A and the cover films 130A, 130B are both films of silicon nitride or the like. However, due to differences in methods of film formation and conditions of film formation, and so on, the cover films 130A, 130B sometimes have a larger density than the sacrifice films 110A. In such a case, it is sometimes more difficult for the cover films 130A, 130B to be oxidized than for the sacrifice films 110A to be oxidized.

In the example illustrated, the sacrifice films 110A are basically covered by the cover films 130A, 130B. However, a vicinity of a contact surface with the cover films 130A, 130B is sometimes oxidized. In such a case, the thickness $W_{111}$ in the radial direction of a portion provided on an inner circumferential surface of a through-hole of the sacrifice film 110A, of the block insulating film 133 becomes larger than the thickness $W_{113}$ in the radial direction of a portion provided on an inner circumferential surface of a through-hole of the interlayer insulating film 101, of the block insulating film 133.

Moreover, in the example of FIG. 14, part of a lower surface of a sacrifice film 110A corresponding to the conductive film 110C is not covered by the cover films 130A, 130B, but exposed to the opening op2. If oxidation treatment is performed in such a state, an oxidized film which is thicker than that of a portion covered by the cover films 130A, 130B is sometimes formed as shown in FIG. 15. In such a case, the thickness $W_{112}$ in the Z direction of the block insulating film 133c becomes larger than the thickness $W_{111}$ in the radial direction of the block insulating films 133a, 133b.

Figure 17:
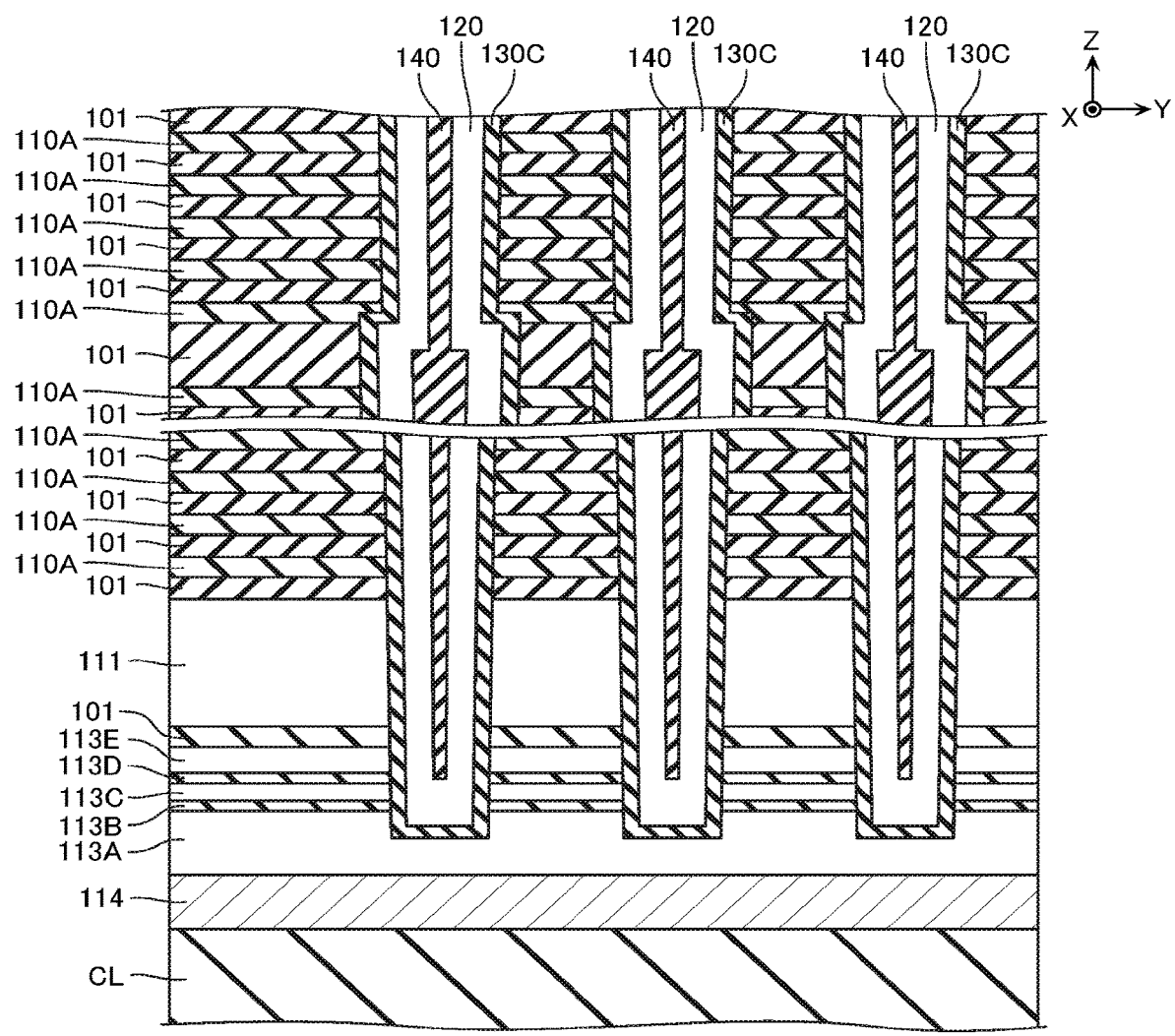
FIG. 17 is a schematic cross-sectional view showing same method of manufacturing.
Figure 18:
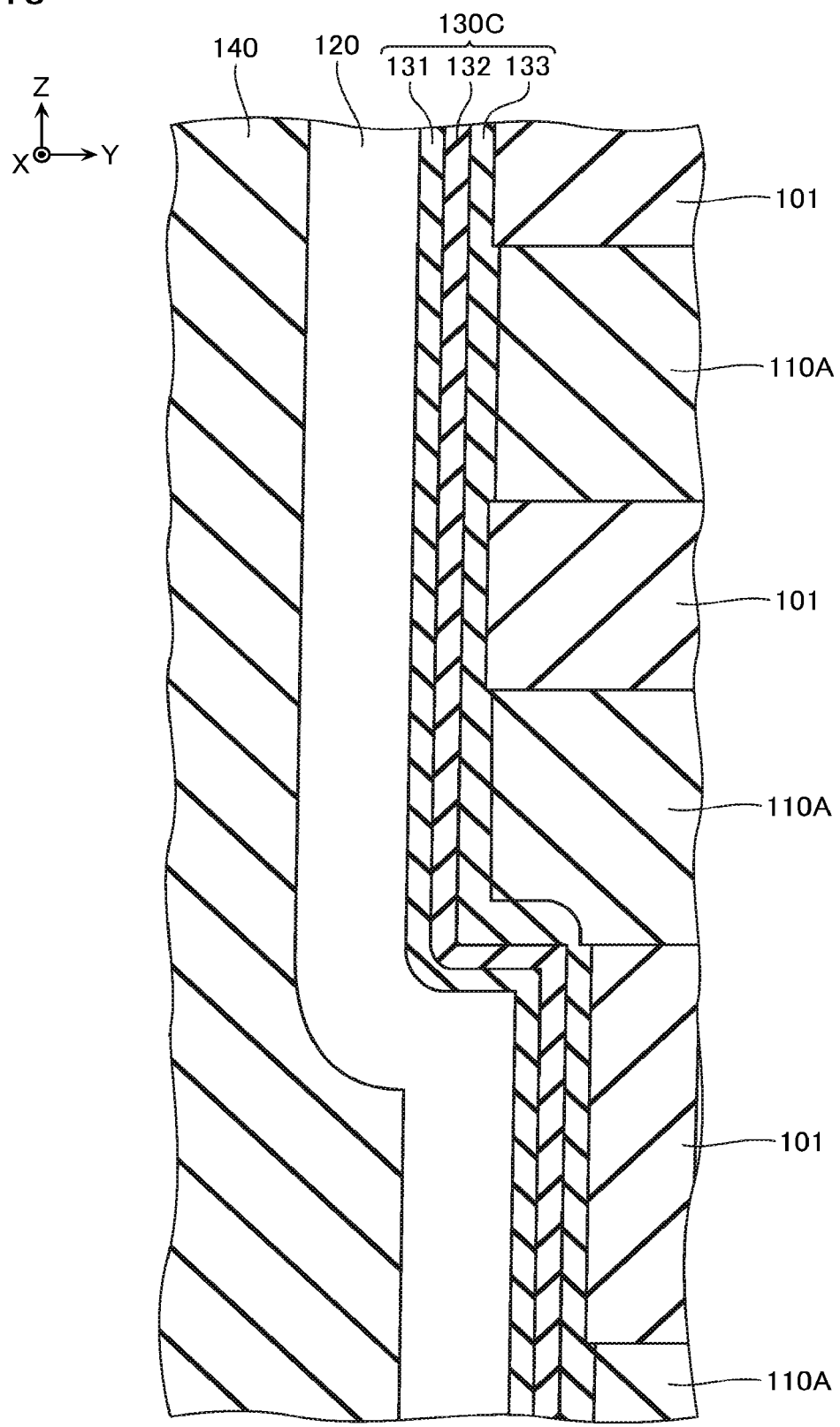
FIG. 18 is a schematic cross-sectional view showing same method of manufacturing.

Next, as shown in FIGS. 17 and 18, a laminated film 130C, the semiconductor film 120, and the insulating film 140 are formed on insides of the openings op1, op2. The laminated film 130C is a laminated film that includes the block insulating film 133, the charge accumulating film 132, and the tunnel insulating film 131. This step is performed by a method such as LPCVD, for example.

Figure 19:
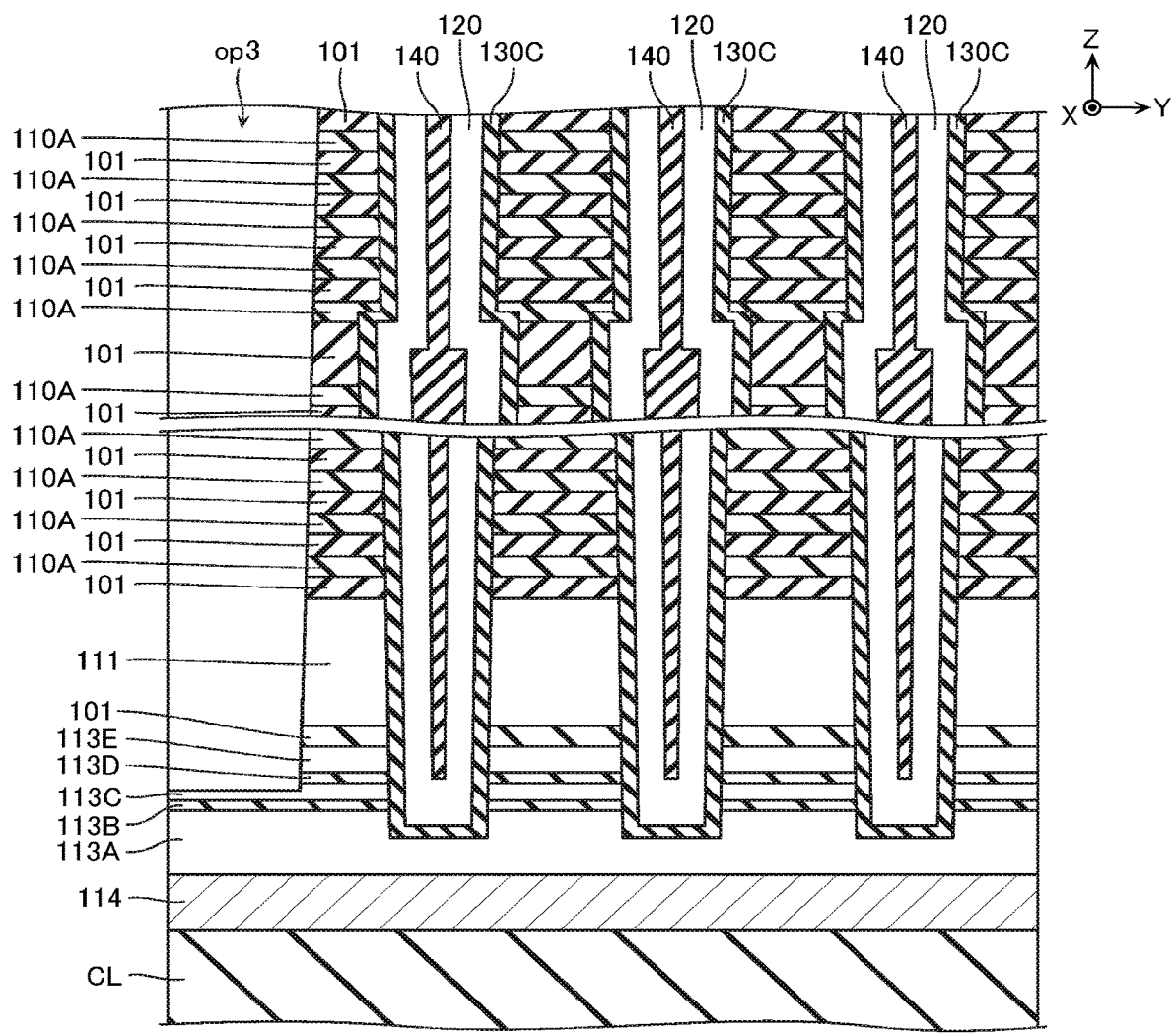
FIG. 19 is a schematic cross-sectional view showing same method of manufacturing.

Next, as shown in FIG. 19, an opening op3 is formed. The opening op3 is a trench that extends in the Z direction and the X direction, divides in the Y direction the sacrifice films 110A, the interlayer insulating films 101, the conductive film 111, the semiconductor film 113E, and the insulating film 113D, and exposes an upper surface of the semiconductor film 113C. This step is performed by a method such as RIE, for example.

Figure 20:
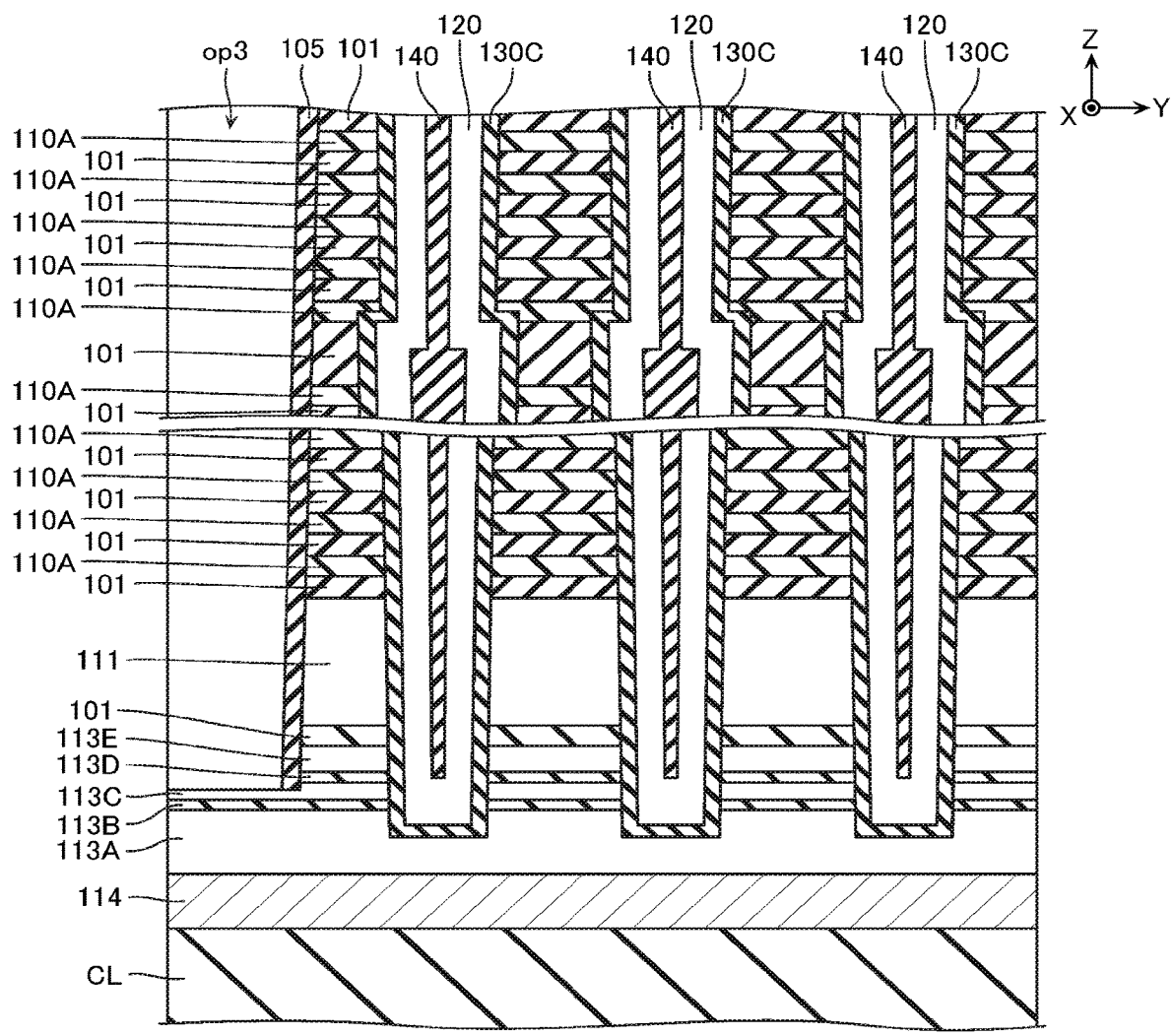
FIG. 20 is a schematic cross-sectional view showing same method of manufacturing.

Next, as shown in FIG. 20, an insulating film 105 of silicon nitride or the like is formed on a side surface in the Y direction of the opening op3. This step is performed by a method such as LPCVD, for example.

Figure 21:
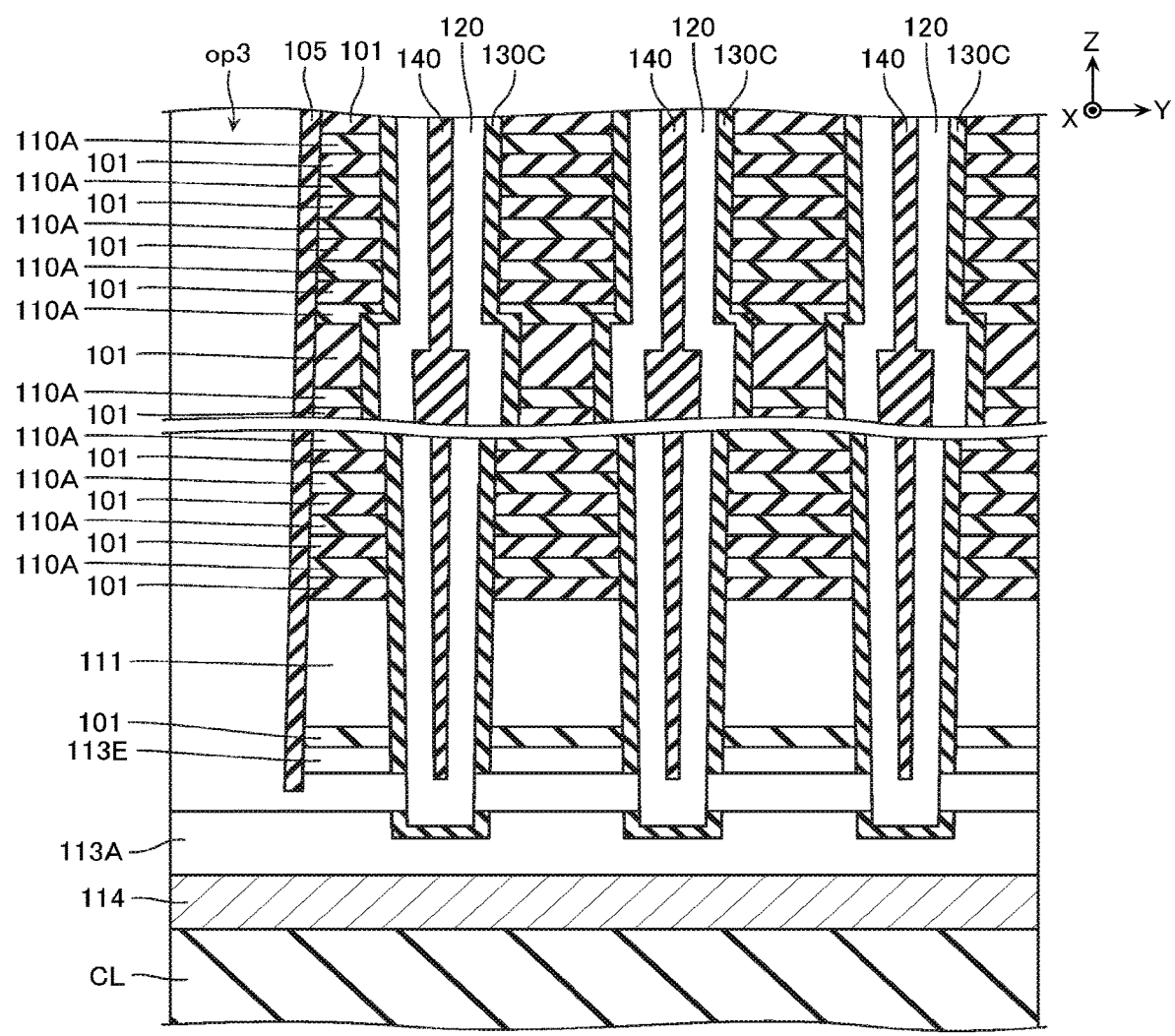
FIG. 21 is a schematic cross-sectional view showing same method of manufacturing.

Next, as shown in FIG. 21, the semiconductor film 113C, the insulating films 113B, 113D, and part of the laminated film 130C, are removed to expose a lower end section of the semiconductor film 120. This step is performed by the likes of wet etching, for example.

Figure 22:
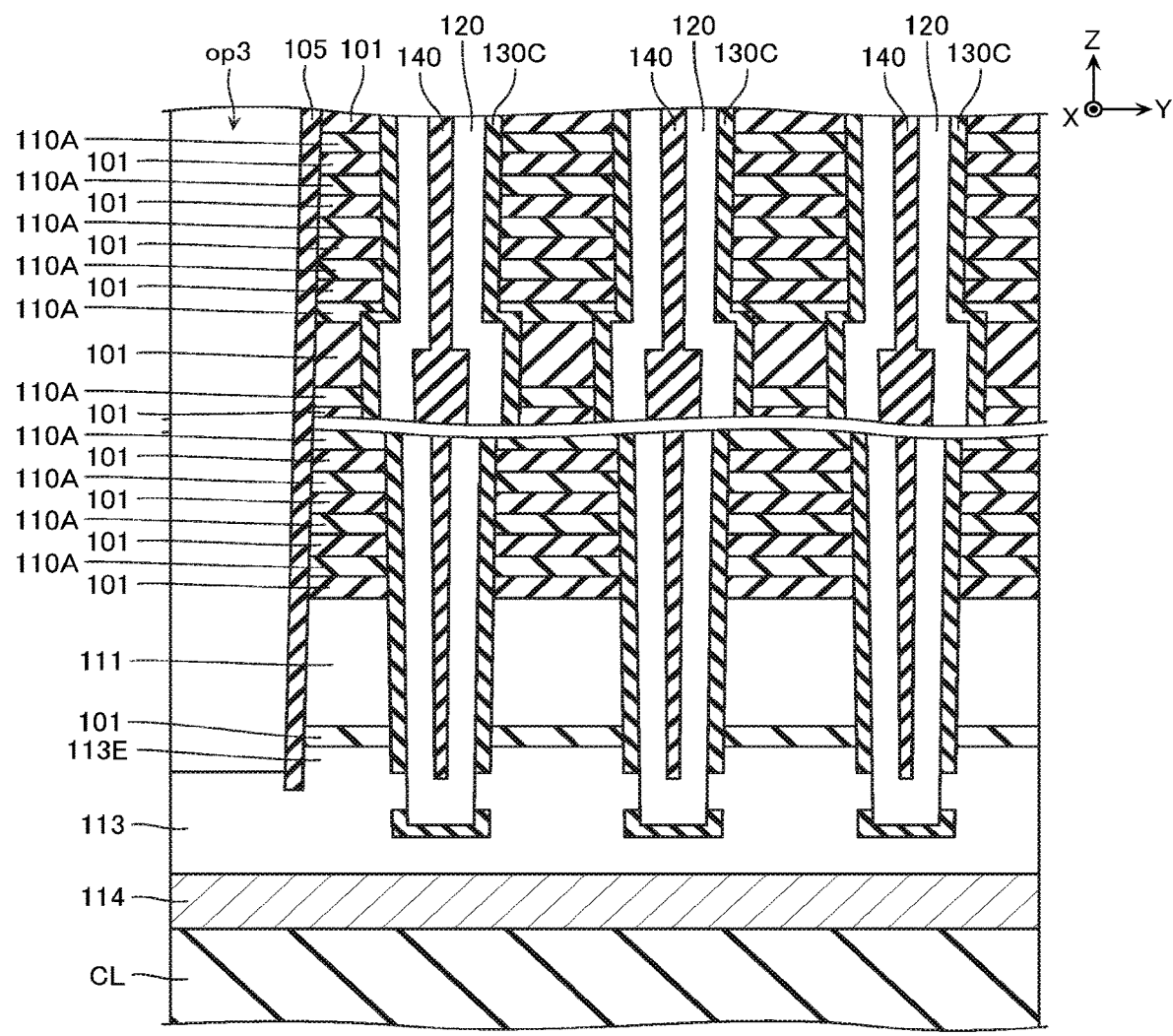
FIG. 22 is a schematic cross-sectional view showing same method of manufacturing.

Next, as shown in FIG. 22, a semiconductor film is formed on an upper surface of the semiconductor film 113A, a lower surface of the semiconductor film 113E, and part of an outer circumferential surface of the semiconductor film 120, thereby forming the semiconductor film 113. This step is performed by a method such as CVD or an epitaxial crystal growth method, for example.

Subsequently, the insulating film 105 is removed by a method such as wet etching, surfaces exposed to the opening op3 of the conductive film 111 and the semiconductor film 113 are selectively oxidized to form insulating films 106, 107, the sacrifice films 110A are removed by a method such as wet etching, the high-permittivity insulating film 134, the barrier metal film 116, and the metal film 115 are formed by a method such as CVD, and an insulating film ST is formed in the opening op3, whereby the configuration described with reference to FIGS. 3 and 4 is formed.

First Comparative Example

Figure 23:
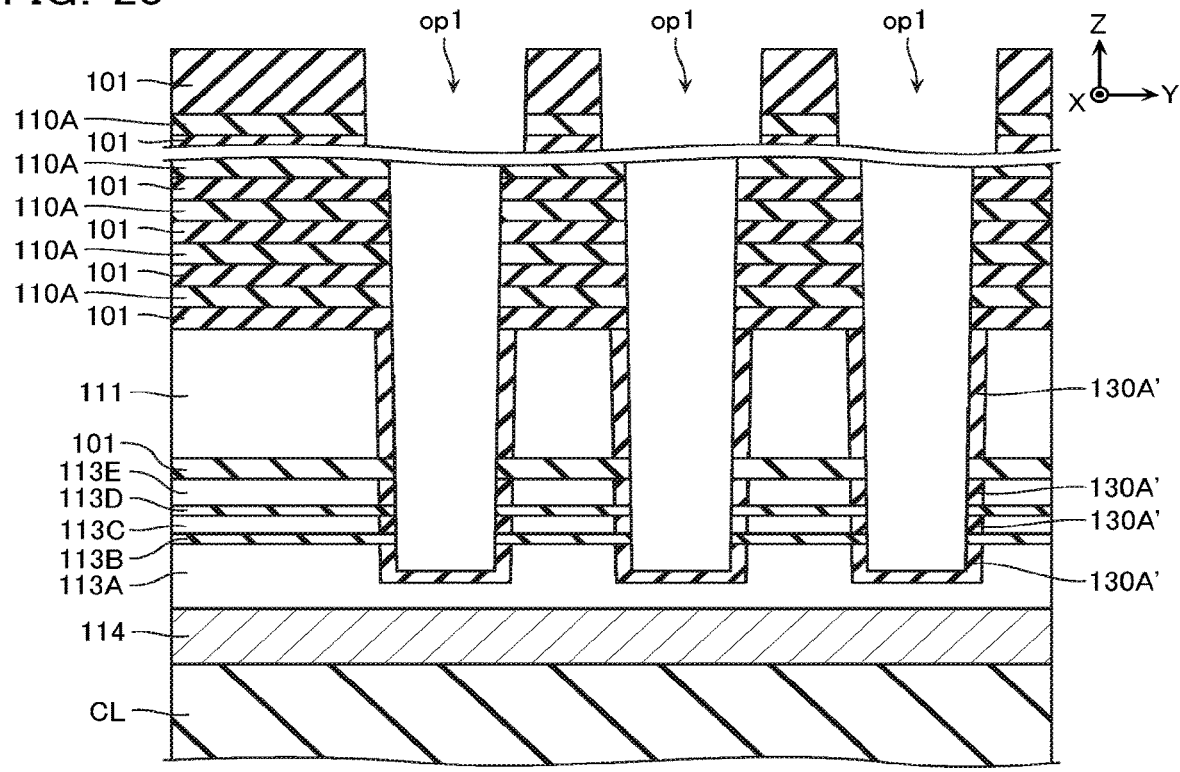
FIG. 23 is a schematic cross-sectional view for describing a first comparative example.

Next, a first comparative example will be described. FIG. 23 is a schematic cross-sectional view for describing a method of manufacturing according to the first comparative example.

The method of manufacturing according to the first comparative example is similar to that of the first embodiment up to the step described with reference to FIG. 6.

In the first embodiment, as described with reference to FIG. 7, the cover film 130A of silicon nitride or the like has been formed on the inside of the opening op1. This makes it possible for the semiconductor films 113A, 113C, 113E, and the conductive film 111 to be protected when removing the sacrifice film 120A.

On the other hand, in the comparative example, as shown in FIG. 23, the cover film 130A is not formed after the opening op1 has been formed, but instead, oxidation treatment is performed, and an oxidized film 130A' is formed on surfaces exposed to the opening op1 of the semiconductor films 113A, 113C, 113E, and the conductive film 111.

Figure 24:
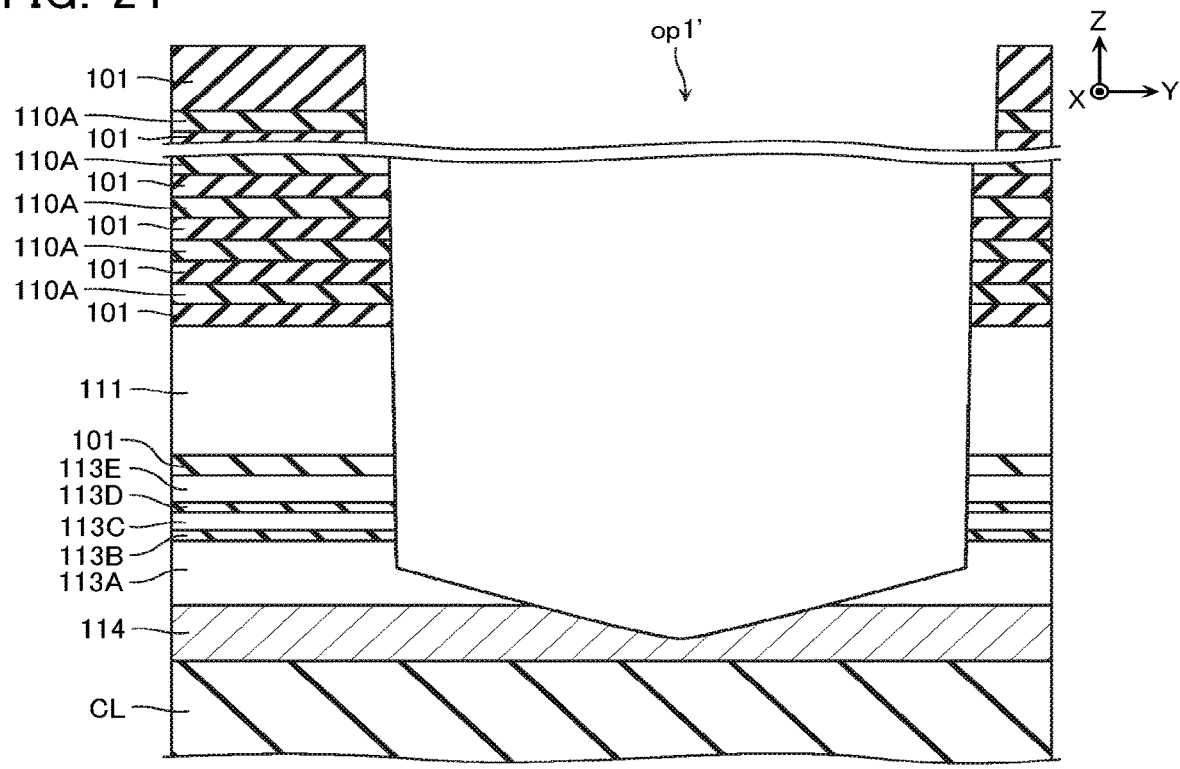
FIG. 24 is a schematic cross-sectional view for describing same comparative example.

Now, as shown in FIG. 24, when forming the opening op1, an opening op1' larger than the opening op1 has sometimes ended up being formed. In such a case, the conductive film 114 has sometimes ended up being exposed to the opening op1'. Sometimes, when oxidation treatment has been performed in this state, abnormal oxidation has occurred in the conductive film 114, and a structure has ended up being broken over a wide range.

Second Comparative Example

Figure 25:
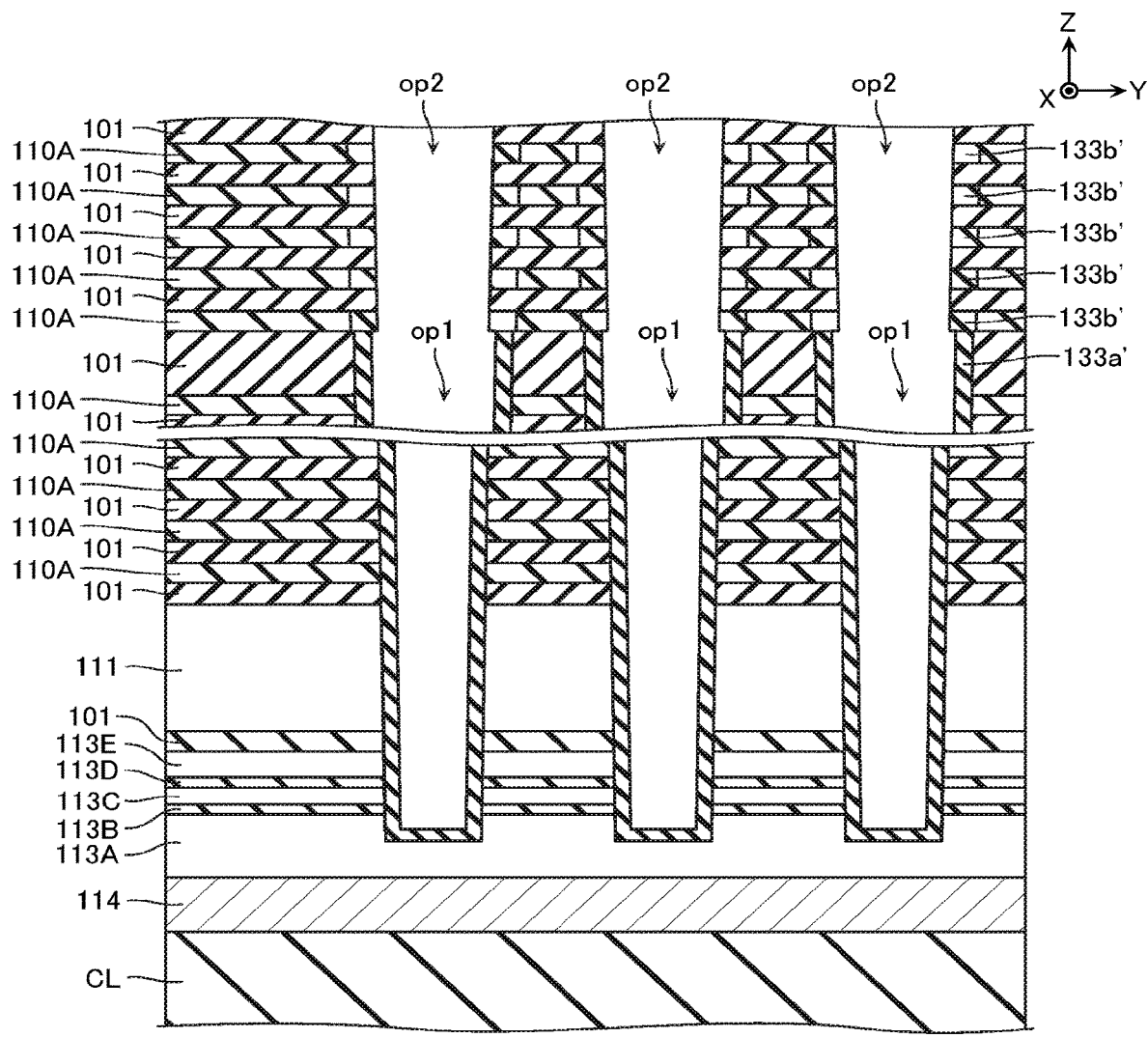
FIG. 25 is a schematic cross-sectional view for describing a second comparative example.

Next, a second comparative example will be described. FIG. 25 is a schematic cross-sectional view for describing a method of manufacturing according to the second comparative example.

The method of manufacturing according to the second comparative example is similar to that of the first embodiment up to the step described with reference to FIG. 9.

In the second comparative example, after having performed the step described with reference to FIG. 9, the sacrifice film 120A is removed and oxidation treatment is performed, whereby block insulating films 133a', 133b' are formed. The block insulating film 133a' is an insulating film formed by oxidizing the cover film 130A. The block insulating film 133b' is an insulating film formed by oxidizing part of the sacrifice film 110A.

In the second comparative example, an oxidation treatment of the kind described with reference to FIG. 23 is not performed. Therefore, a problem of abnormal oxidation of the kind described with reference to FIG. 24 does not occur.

However, in the second comparative example, the likes of film thicknesses or film qualities end up differing between the block insulating film 133a' and the block insulating film 133b'. Therefore, characteristics of the formed memory cells MC sometimes end up varying greatly.

Third Comparative Example

Figure 26:
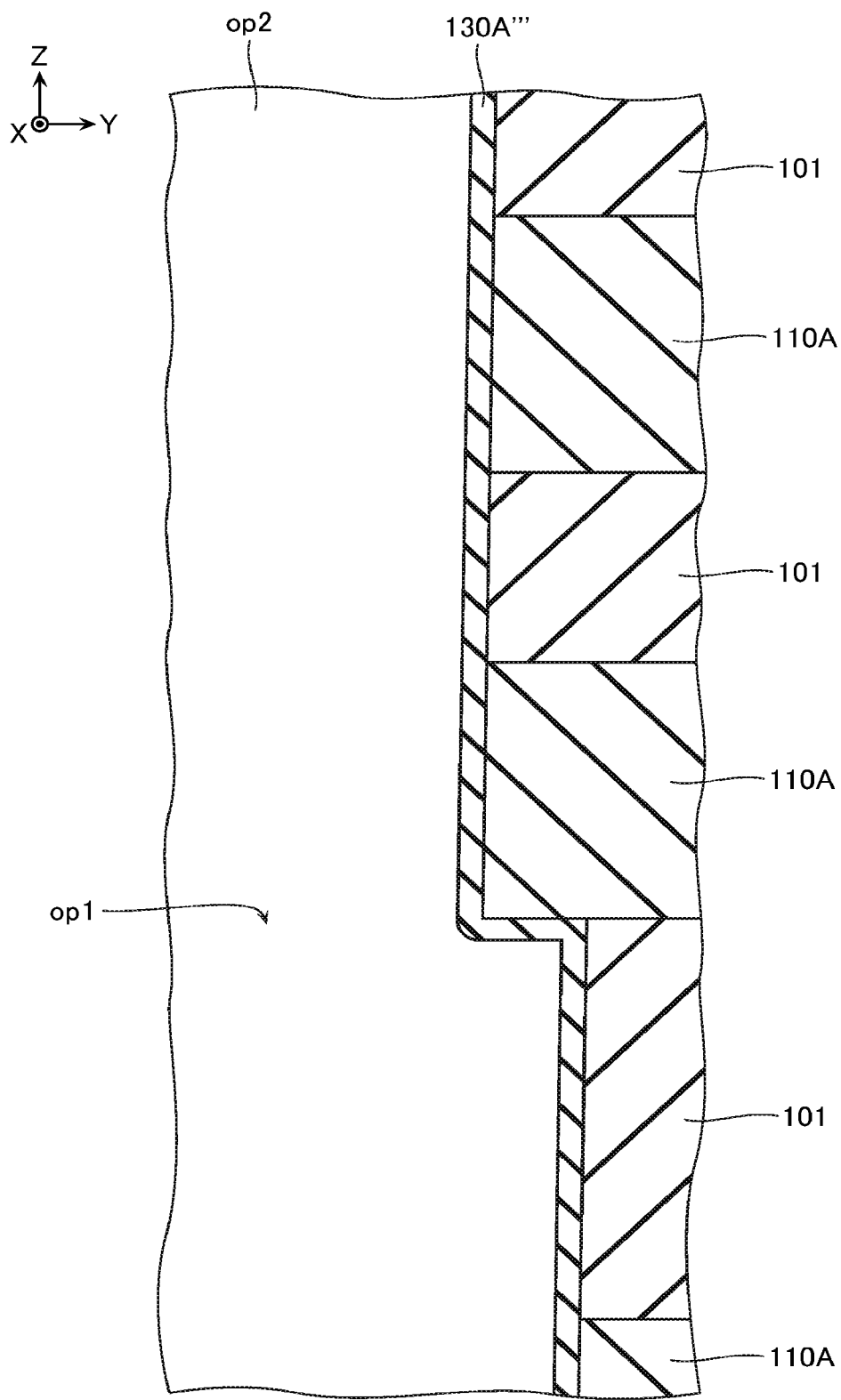
FIG. 26 is a schematic cross-sectional view for describing a third comparative example.
Figure 27:
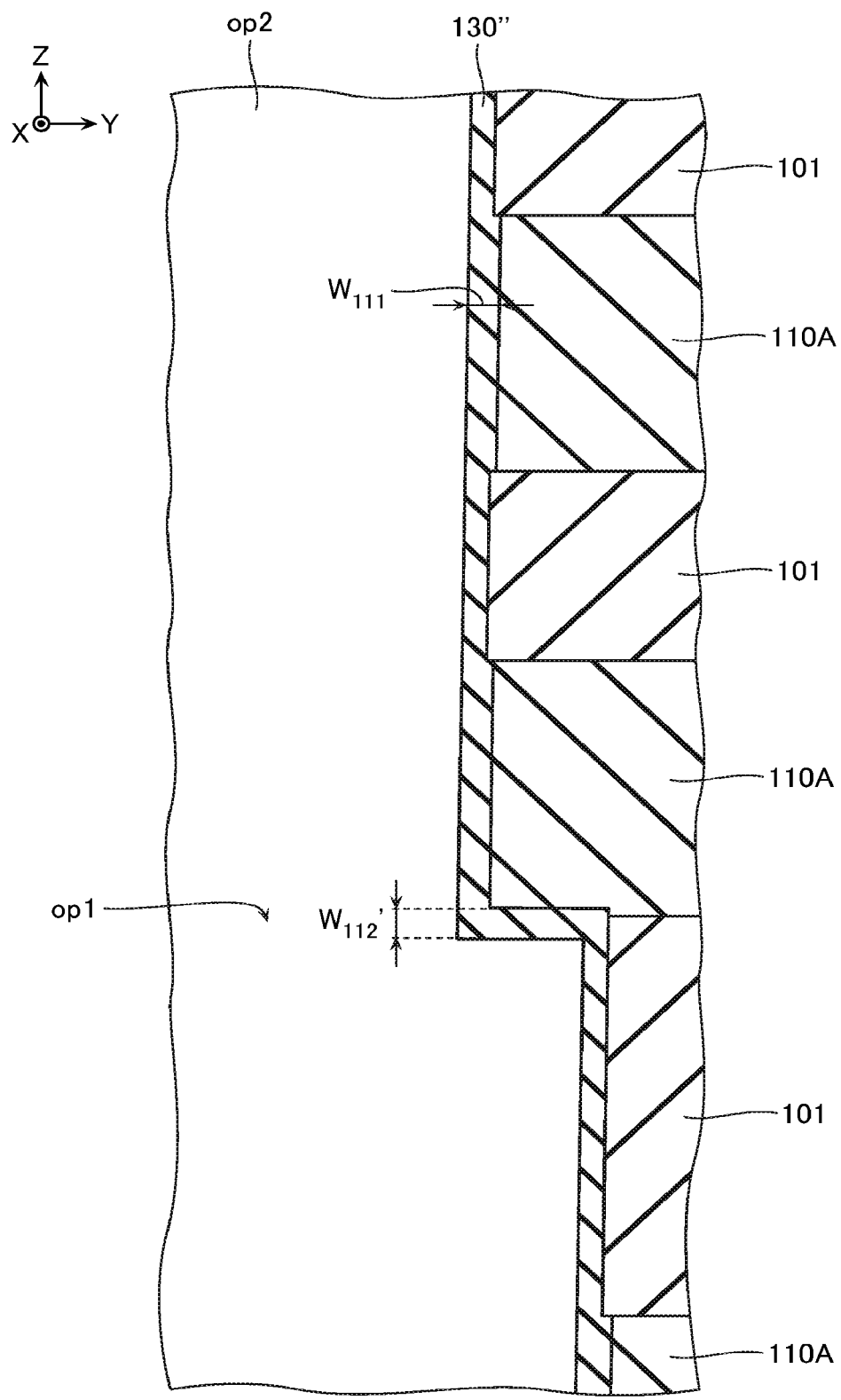
FIG. 27 is a schematic cross-sectional view for describing same comparative example.
Figure 28:
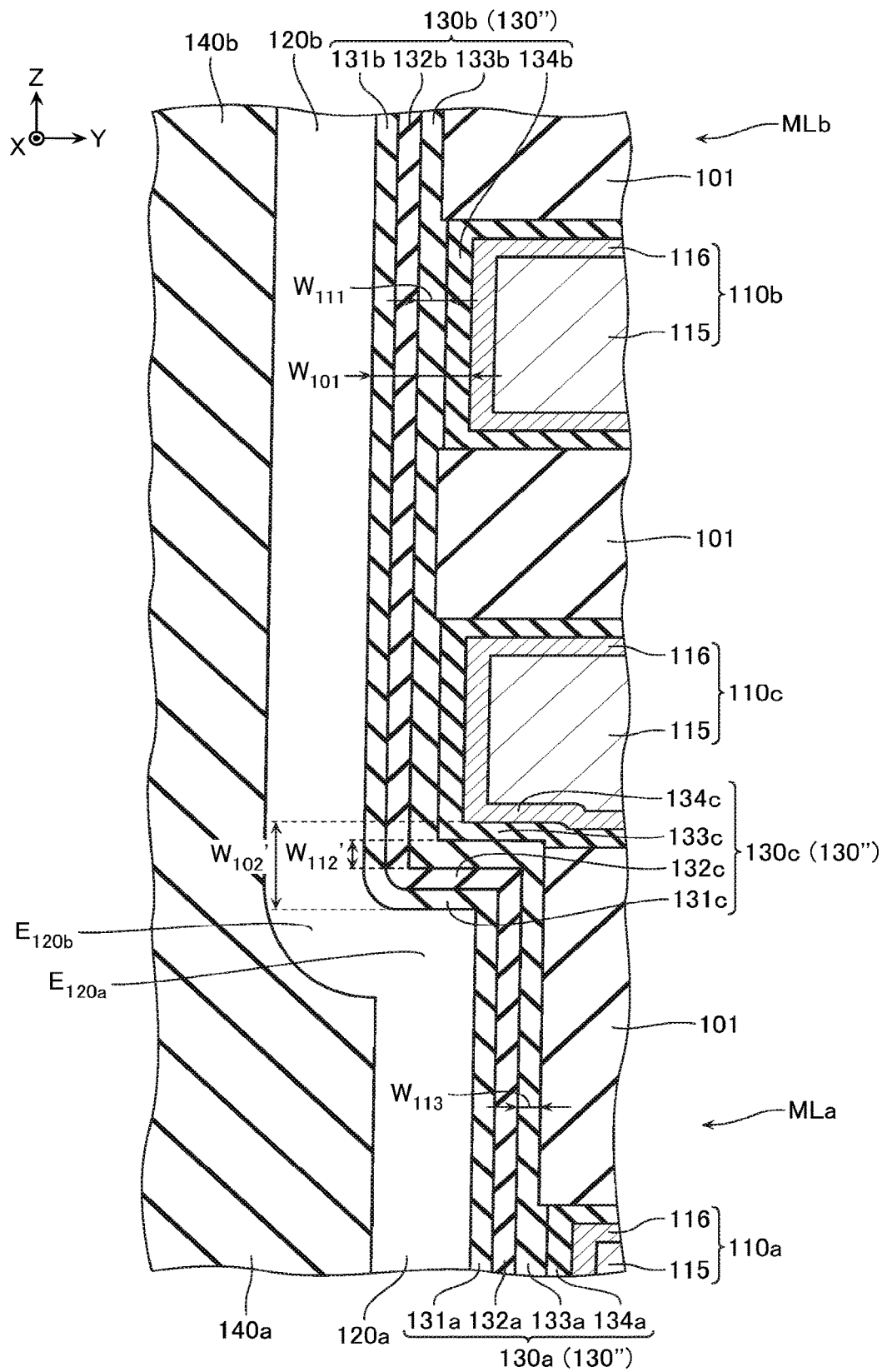
FIG. 28 is a schematic cross-sectional view for describing same comparative example.

Next, a third comparative example will be described. FIGS. 26 and 27 are schematic cross-sectional view for describing a method of manufacturing according to the third comparative example. FIG. 28 is a schematic cross-sectional view for describing a configuration of a semiconductor memory device according to the third comparative example.

The method of manufacturing according to the third comparative example is similar to that of the first embodiment up to the step described with reference to FIG. 9.

In the third comparative example, after having performed the step described with reference to FIG. 9, the sacrifice film 120A and the cover film 130A are removed, and, as shown in FIG. 26, an insulating film 130A" of silicon nitride or the like is formed on inner circumferential surfaces of the opening op1 and the opening op2. Moreover, as shown in FIG. 27, a block insulating film 130" is formed by oxidation treatment.

Now, whereas in the first embodiment, a lower surface of some of the sacrifice films 110A has been exposed to the opening op2 during oxidation treatment (refer to FIG. 14), in the comparative example, this portion too is covered by the insulating film 130A". Therefore, a thickness $W_{112'}$ of an oxidized film formed in this portion will be of the same degree as the thickness $W_{111}$ of an oxidized film formed on the inner circumferential surface of the through-hole of the sacrifice film 110A. Therefore, as shown in FIG. 28, a thickness $W_{102'}$ in the Z direction of the gate insulating film 130c also will be of the same degree as the thickness $W_{101}$ in the radial direction of the gate insulating films 130a, 130b.

Moreover, a shortest distance from the upper end section $E_{120a}$ of the semiconductor film 120a to the conductive film 110c also will be of the same degree as shortest distances from the semiconductor films 120a, 120b to the conductive films 110a, 110b.

In the third comparative example, similarly to in the second comparative example, the problem of abnormal oxidation does not occur. Moreover, in the third comparative example, it is possible to suppress the above-mentioned kind of variation in characteristics of the memory cells MC.

Advantages of First Embodiment

In the method of manufacturing according to the first embodiment, the problem of abnormal oxidation of the kind described with reference to FIG. 24 does not occur. Moreover, the problem of variation in characteristics of the memory cells MC of the kind described with reference to FIG. 25 does not occur either.

In addition, as a result of study by the inventors, it has been understood that the larger the distance between the upper end section $E_{120a}$ of the semiconductor film 120a and the conductive film 110c is, the more preferably the erase operation of the memory cell MC whose gate electrode is the conductive film 110c, can be performed.

As mentioned above, due to the present embodiment, the distance between the upper end section $E_{120a}$ of the semiconductor film 120a and the conductive film 110C can be made larger compared to in the semiconductor memory device according to the third comparative example. It is therefore possible to provide a semiconductor memory device that can be preferably controlled, by improving erase characteristics of the memory cell MC whose gate electrode is the conductive film 110c.

Modified Examples of First Embodiment

In the step described with reference to FIG. 13, part of the cover film 130B is removed by a method such as wet etching. In the example shown in FIG. 13, removal of the cover film 130B has been ended at a timing when a height (a distance from the substrate S or position in the Z direction) of a lower end of the cover film 130B has reached a height of an upper end of the cover film 130A. However, removal of the cover film 130B may be ended before the height of the lower end of the cover film 130B reaches the height of the upper end of the cover film 130A, or may be ended after the height of the lower end of the cover film 130B has reached the height of the upper end of the cover film 130A.

Figure 29:
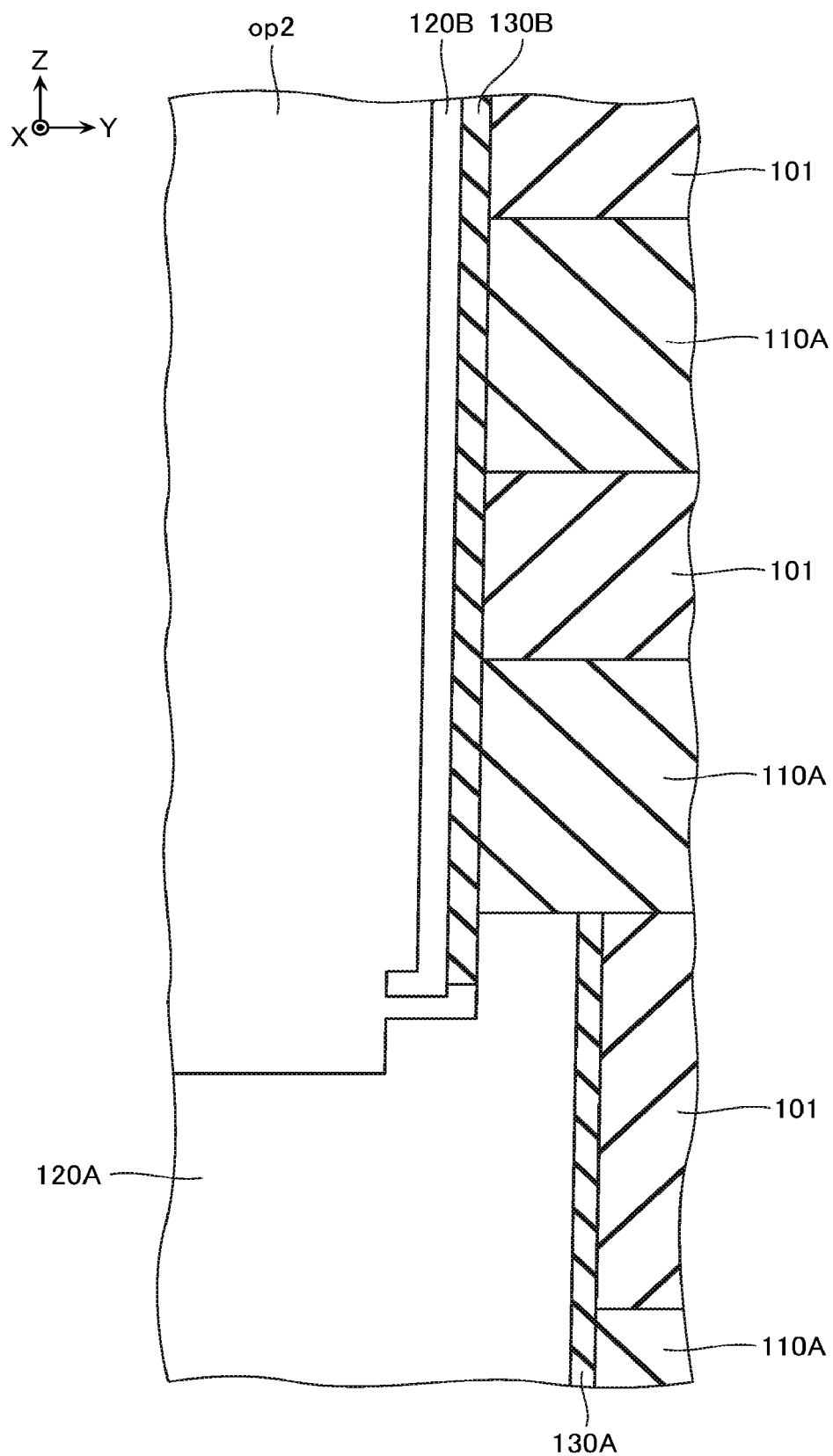
FIG. 29 is a schematic cross-sectional view for describing a modified example of the first embodiment.
Figure 30:
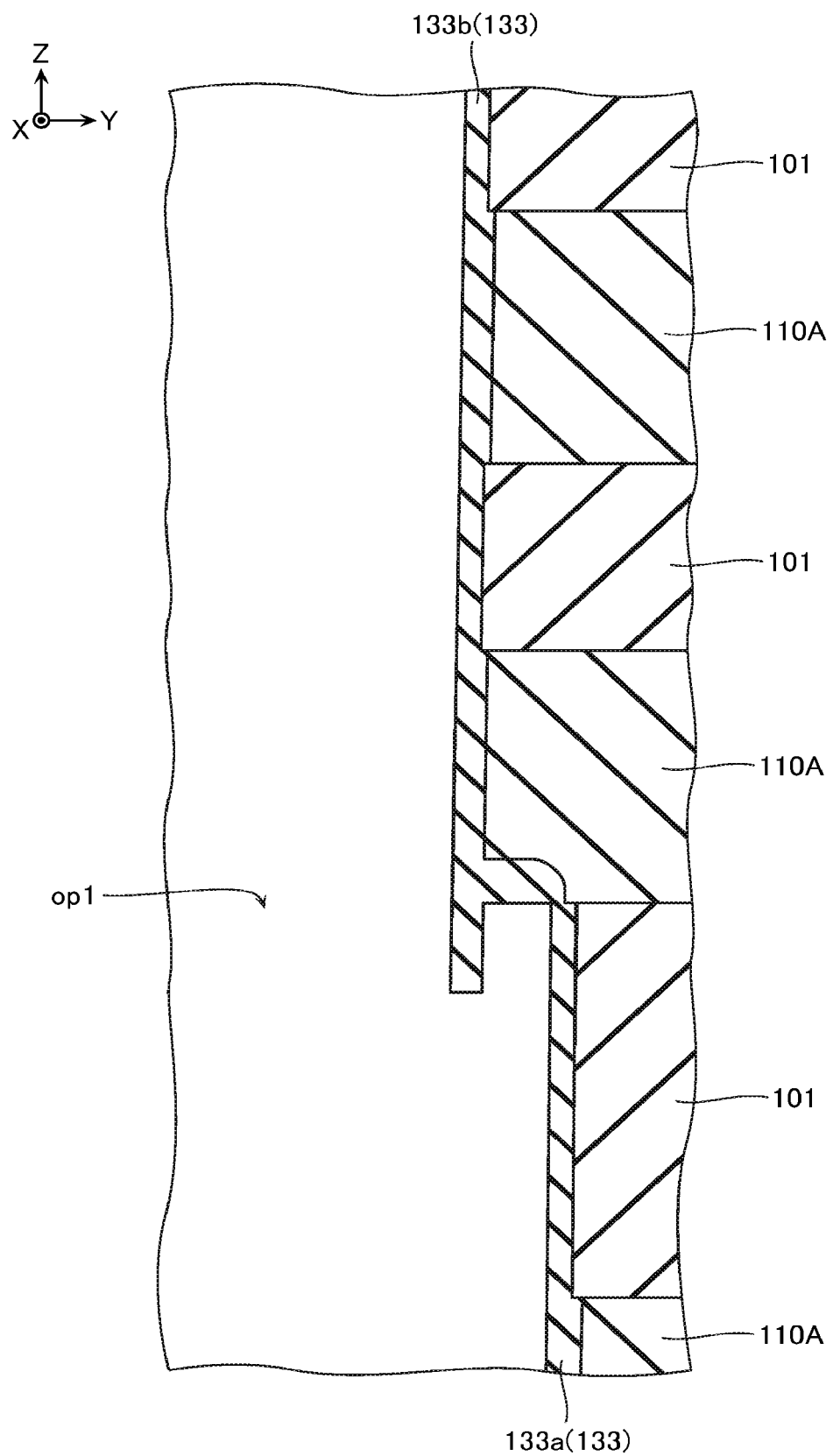
FIG. 30 is a schematic cross-sectional view for describing same modified example.

When, for example, as shown in FIG. 29, removal of the cover film 130B has been ended before the height of the lower end of the cover film 130B reaches the height of the upper end of the cover film 130A, it results in a lower end of the block insulating film 133b being positioned more downwardly than an upper end of the block insulating film 133a is, as shown in FIG. 30.

Figure 31:
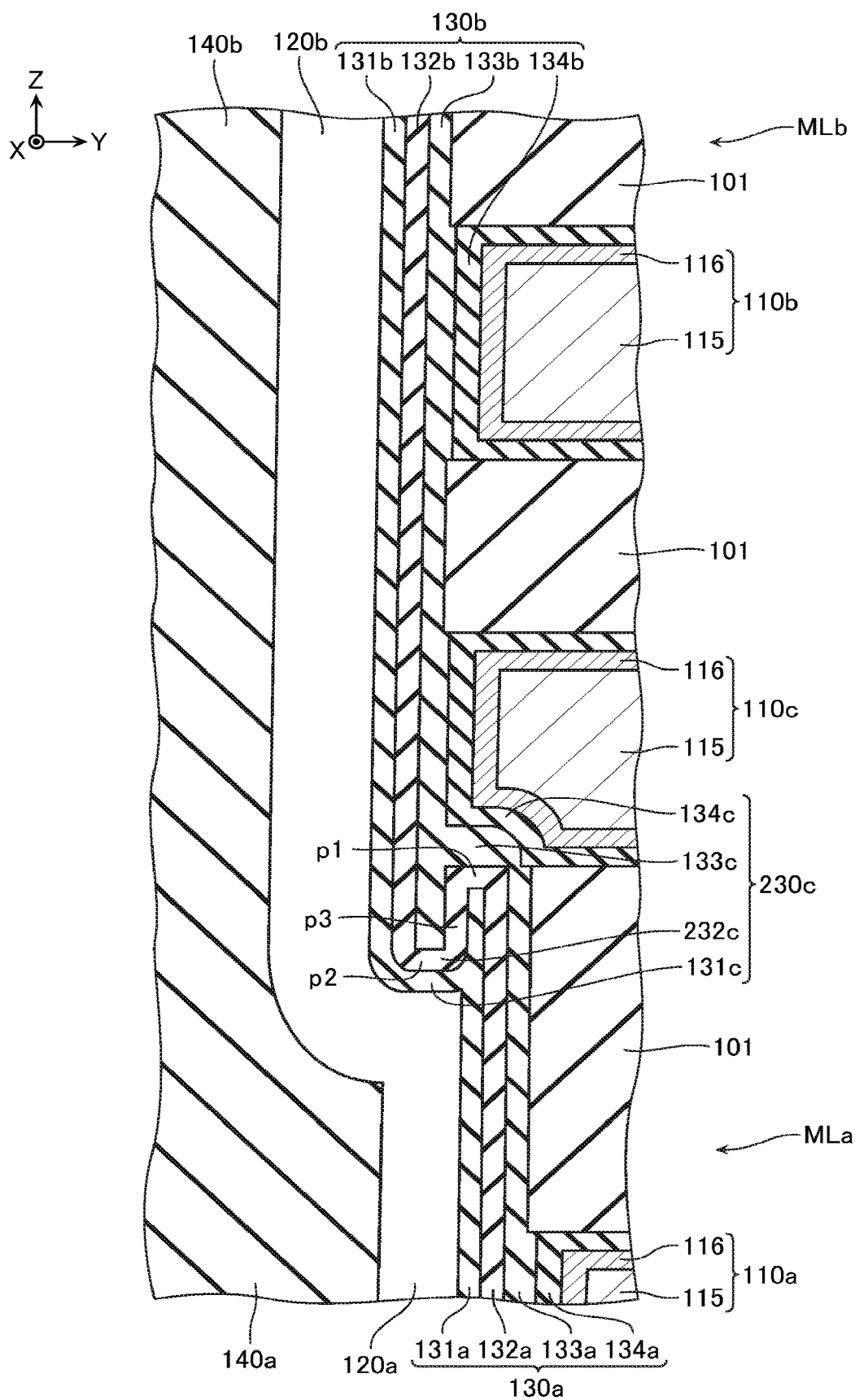
FIG. 31 is a schematic cross-sectional view for describing same modified example.

In the semiconductor memory device formed in this way, lower ends of the tunnel insulating film 131b, the charge accumulating film 132b, and the block insulating film 133b will be positioned more downwardly than upper ends of the tunnel insulating film 131a, the charge accumulating film 132a, and the block insulating film 133a are, as shown in FIG. 31.

Moreover, as illustrated, the charge accumulating film 232c will sometimes have a shape that includes: a first portion p1 connected to the upper end of the charge accumulating film 132a and extending in the radial direction; a second portion p2 connected to the lower end of the charge accumulating film 132b and extending in the radial direction; and a third portion p3 connected to these first portion p1 and second portion p2 and extending in the Z direction.

Figure 32:
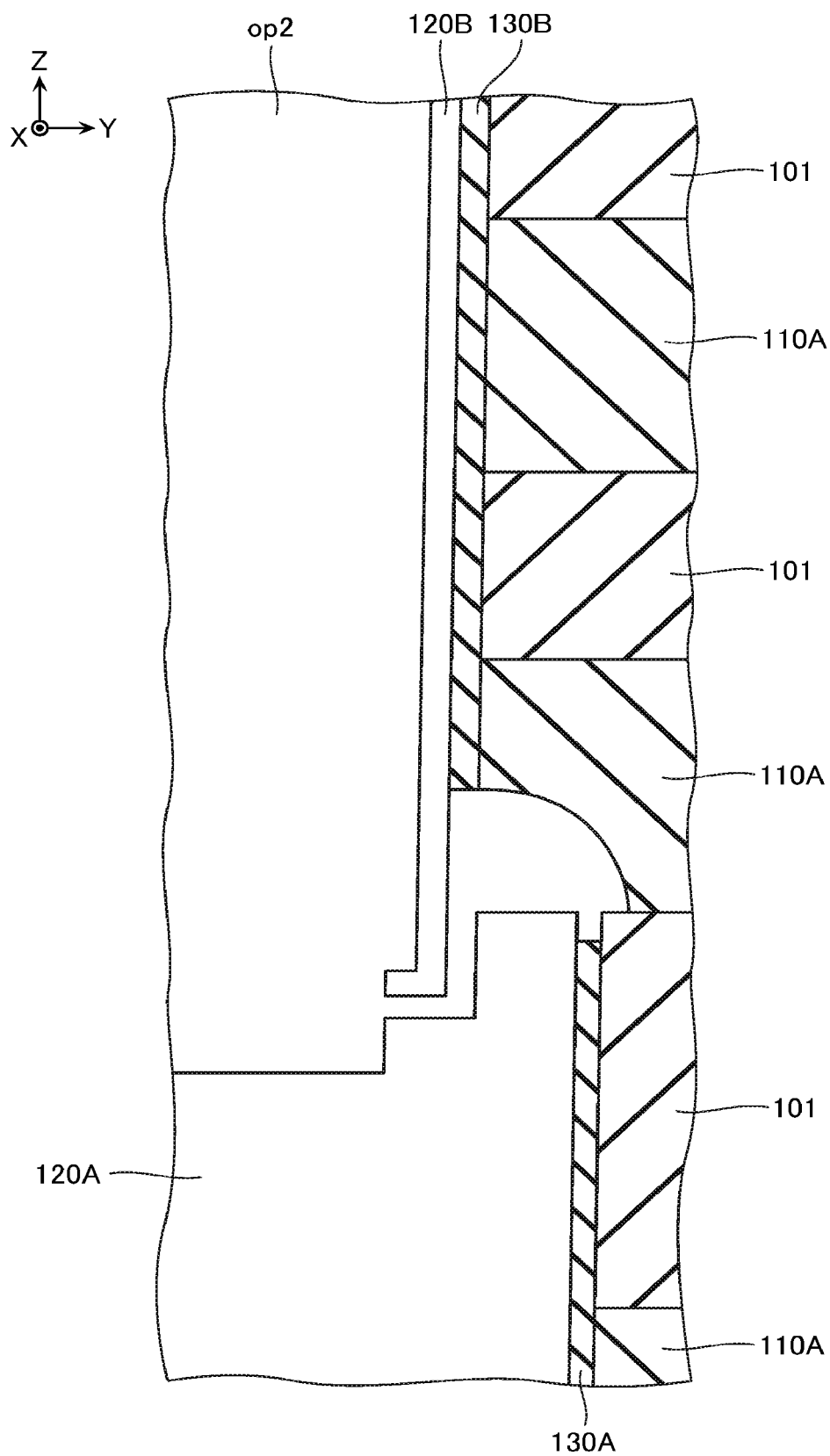
FIG. 32 is a schematic cross-sectional view for describing a modified example of the first embodiment.
Figure 33:
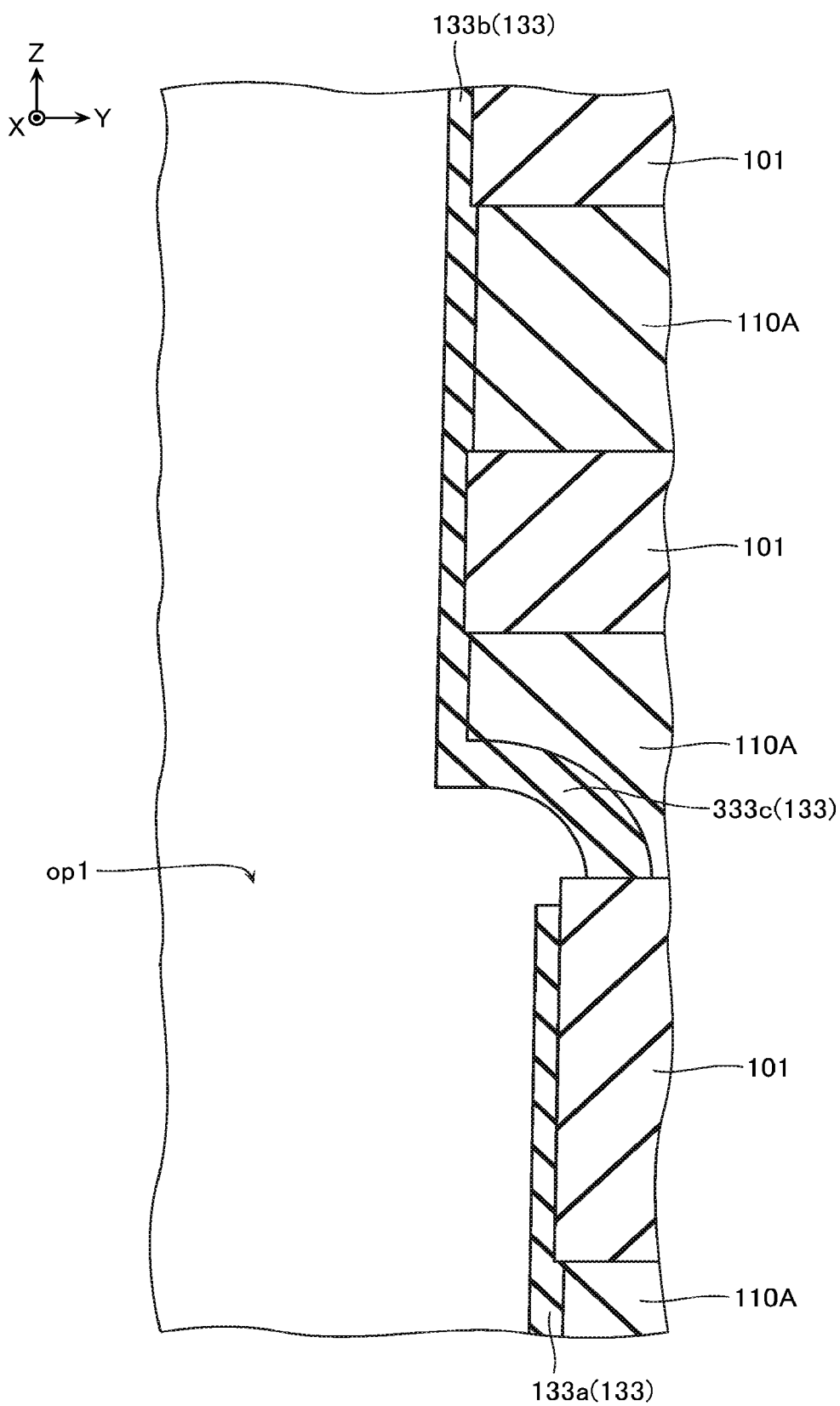
FIG. 33 is a schematic cross-sectional view for describing same modified example.

Moreover, when, for example, as shown in FIG. 32, removal of the cover film 130B has been ended after the height of the lower end of the cover film 130B has reached the height of the upper end of the cover film 130A, part of the sacrifice film 110A is also sometimes removed. In such a case, it results in the lower end of the block insulating film 133b being positioned more upwardly than the upper end of the block insulating film 133a is, as shown in FIG. 33. Moreover, in such a case, a block insulating film 333c is sometimes not connected to the block insulating film 133a.

Figure 34:
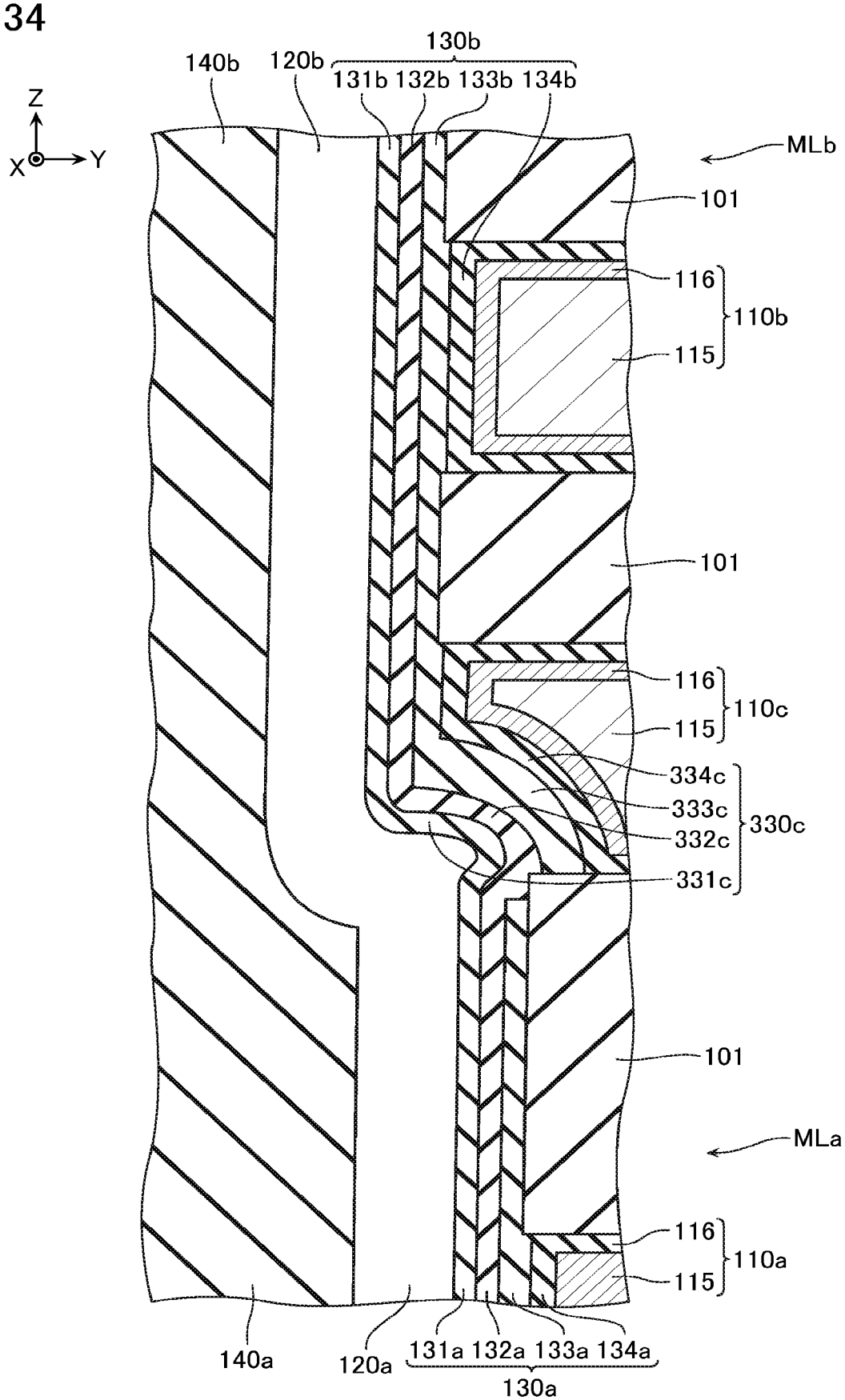
FIG. 34 is a schematic cross-sectional view for describing same modified example.

In the semiconductor memory device formed in this way, lower ends of the tunnel insulating film 131b, the charge accumulating film 132b, and the block insulating film 133b will be positioned more upwardly than upper ends of the tunnel insulating film 131a, the charge accumulating film 132a, and the block insulating film 133a are, as shown in FIG. 34.

Moreover, sometimes, as illustrated, a curved surface is formed at the upper end of the semiconductor film 120a, and a tunnel insulating film 331c, a charge accumulating film 332c, a block insulating film 333c, a high-permittivity insulating film 334c, and part of the barrier metal film 116 will each be shaped in such a manner as to form a curved surface following this curved surface.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a substrate;
    a plurality of first gate electrodes that are arranged in a first direction intersecting a surface of the substrate and extend in a second direction intersecting the first direction;
    a first semiconductor film that extends in the first direction and faces the plurality of first gate electrodes, a width in the second direction of one end on a substrate side of the first semiconductor film being smaller than a width in the second direction of an other end of the first semiconductor film;
    a first gate insulating film that extends in the first direction and is provided between the plurality of first gate electrodes and the first semiconductor film;
    a plurality of second gate electrodes that are arranged in the first direction, extend in the second direction, and are further from the substrate than the plurality of first gate electrodes are;
    a second semiconductor film that extends in the first direction and faces the plurality of second gate electrodes, a width in the second direction of one end on the substrate side of the second semiconductor film being smaller than the width in the second direction of the other end of the first semiconductor film, a width in the second direction of an other end of the second semiconductor film being larger than the width in the second direction of the one end of the second semiconductor film, and the one end of the second semiconductor film being connected to the other end of the first semiconductor film;
    a second gate insulating film that extends in the first direction and is provided between the plurality of second gate electrodes and the second semiconductor film;
    a third gate electrode that is provided between the plurality of first gate electrodes and the plurality of second gate electrodes, extends in the second direction, and faces the other end of the first semiconductor film at a surface on the substrate side; and
    a third gate insulating film that is provided between the third gate electrode and the other end of the first semiconductor film, and is connected to the first gate insulating film and the second gate insulating film,
    the third gate electrode facing the second semiconductor film via the second gate insulating film, and facing the other end of the first semiconductor film via the third gate insulating film, and
    a thickness in the first direction of the third gate insulating film being larger than a thickness in the second direction of the first gate insulating film and the second gate insulating film.

2. The semiconductor memory device according to claim 1, wherein
    the first gate insulating film comprises:
    a first insulating film provided between the first gate electrode and the first semiconductor film;
    a first charge accumulating film provided between the first gate electrode and the first insulating film; and
    a second insulating film provided between the first gate electrode and the first charge accumulating film,
    the second gate insulating film comprises:
    a third insulating film provided between the second gate electrode and the second semiconductor film;
    a second charge accumulating film provided between the second gate electrode and the third insulating film; and
    a fourth insulating film provided between the second gate electrode and the second charge accumulating film, and
    the third gate insulating film comprises:
    a fifth insulating film provided between the third gate electrode and the first semiconductor film;
    a third charge accumulating film provided between the third gate electrode and the fifth insulating film; and
    a sixth insulating film provided between the third gate electrode and the third charge accumulating film.

3. The semiconductor memory device according to claim 2, wherein
    the fifth insulating film is connected to the first insulating film and the third insulating film,
    the third charge accumulating film is connected to the first charge accumulating film and the second charge accumulating film, and
    the sixth insulating film is connected to the second insulating film and the fourth insulating film.

4. The semiconductor memory device according to claim 2, wherein
    an end section on the substrate side in the first direction of the third insulating film is closer to the substrate than an end section on an opposite side to the substrate in the first direction of the first insulating film is, an end section on the substrate side in the first direction of the second charge accumulating film is closer to the substrate than an end section on an opposite side to the substrate in the first direction of the first charge accumulating film is, and an end section on the substrate side in the first direction of the fourth insulating film is closer to the substrate than an end section on an opposite side to the substrate in the first direction of the second insulating film is.

5. The semiconductor memory device according to claim 2, wherein an end section on the substrate side in the first direction of the third insulating film is further from the substrate than an end section on an opposite side to the substrate in the first direction of the first insulating film is, an end section on the substrate side in the first direction of the second charge accumulating film is further from the substrate than an end section on an opposite side to the substrate in the first direction of the first charge accumulating film is, and an end section on the substrate side in the first direction of the fourth insulating film is further from the substrate than an end section on an opposite side to the substrate in the first direction of the second insulating film is.

6. The semiconductor memory device according to claim 2, wherein a thickness in the first direction of the sixth insulating film is larger than a thickness in the second direction of the second insulating film, and is larger than a thickness in the second direction of the fourth insulating film.

7. The semiconductor memory device according to claim 2, wherein in the case that a difference between a thickness in the first direction of the sixth insulating film and a thickness in the second direction of the second insulating film is assumed to be a first difference, a difference between the thickness in the first direction of the sixth insulating film and a thickness in the second direction of the fourth insulating film is assumed to be a second difference, a difference between a thickness in the first direction of the fifth insulating film and a thickness in the second direction of the first insulating film is assumed to be a third difference, and a difference between the thickness in the first direction of the fifth insulating film and a thickness in the second direction of the third insulating film is assumed to be a fourth difference, the first difference and the second difference are larger than the third difference and the fourth difference.

8. The semiconductor memory device according to claim 2, further comprising:

a first interlayer insulating film provided between the plurality of first gate electrodes; and a second interlayer insulating film provided between the plurality of second gate electrodes, wherein the second insulating film comprises:

a first portion provided between the first gate electrode and the first semiconductor film; and a second portion provided between the first interlayer insulating film and the first semiconductor film, the fourth insulating film comprises:

a third portion provided between the second gate electrode and the second semiconductor film; and a fourth portion provided between the second interlayer insulating film and the second semiconductor film, a thickness in the second direction of the first portion is larger than a thickness in the second direction of the second portion, and a thickness in the second direction of the third portion is larger than a thickness in the second direction of the fourth portion.

9. The semiconductor memory device according to claim 8, wherein in the case that a difference between the thickness in the second direction of the first portion and the thickness in the second direction of the second portion is assumed to be a first difference, a difference between the thickness in the second direction of the third portion and the thickness in the second direction of the fourth portion is assumed to be a second difference, a difference between a thickness in the first direction of the fifth insulating film and a thickness in the second direction of the first insulating film is assumed to be a third difference, and a difference between the thickness in the first direction of the fifth insulating film and a thickness in the second direction of the third insulating film is assumed to be a fourth difference, the first difference and the second difference are larger than the third difference and the fourth difference.

* * * * *